(12) United States Patent  (10) Patent No.: US 7,608,237 B2
Alexandridis et al.  (45) Date of Patent: *Oct. 27, 2009

(54) SYNTHESIS OF NANOSTRUCTURED MATERIALS USING LIQUID CRYSTALLINE TEMPLATES

(75) Inventors: Paschalis Alexandridis, E. Amherst, NY (US); Georgios N. Karanikolos, Minneapolis, MN (US); Triantafillos J. Mountziaris, Williamsville, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 351 days.

This patent is subject to a terminal disclaimer.

(21) Appl. No.: 11/391,022

(22) Filed: Mar. 28, 2006

(65) Prior Publication Data

US 2006/0275196 A1    Dec. 7, 2006

Related U.S. Application Data

(60) Provisional application No. 60/665,778, filed on Mar. 28, 2005.

(51) Int. Cl.
*C01B 17/00* (2006.01)
*C01B 19/00* (2006.01)
*C01B 19/04* (2006.01)

(52) U.S. Cl. .................... 423/508; 423/509; 423/511; 423/566.1; 423/592.1; 423/594.18; 423/618; 423/622; 252/62.3 ZT; 252/62.3 V; 977/700; 977/773; 977/811

(58) Field of Classification Search .......... 252/62.3 ZT, 252/62.3 V; 423/508, 509, 511, 566.1, 592.1, 423/594.18, 618, 622; 977/700, 773, 811
See application file for complete search history.

(56) References Cited

U.S. PATENT DOCUMENTS

| | | | |
|---|---|---|---|
| 5,019,400 A | 5/1991 | Gombotz et al. | |
| 5,133,955 A | 7/1992 | Raghavan et al. | |
| 5,147,841 A | 9/1992 | Wilcoxon | |
| 5,260,957 A | 11/1993 | Hakimi et al. | |
| 5,262,357 A | 11/1993 | Alivisatos et al. | |
| 5,505,928 A | 4/1996 | Alivisatos et al. | |
| 5,537,000 A | 7/1996 | Alivisatos et al. | |
| 5,751,018 A | 5/1998 | Alivisatos et al. | |
| 5,990,479 A | 11/1999 | Weiss et al. | |
| 6,207,229 B1 | 3/2001 | Bawendi et al. | |
| 6,207,392 B1 | 3/2001 | Weiss et al. | |
| 6,225,198 B1 | 5/2001 | Alivisatos et al. | |
| 6,235,224 B1 | 5/2001 | Mathiowitz et al. | |
| 6,251,303 B1 | 6/2001 | Bawendi et al. | |

(Continued)

OTHER PUBLICATIONS

Yurong Ma et al. "Facile Synthesis of Hollow ZnS Nanospheres in Block Copolymer Solutions" Langmuir, vol. 19, pp. 4040- 4042 (2003).*

(Continued)

*Primary Examiner*—Timothy C Vanoy
(74) *Attorney, Agent, or Firm*—Nixon Peabody LLP

(57) ABSTRACT

A process for synthesizing nanostructures is disclosed. The process involves forming a liquid crystalline template by combining a block copolymer, a first reactant in a polar phase, and a nonpolar phase, then contacting the template with a gas phase composed of a second reactant, under conditions effective to form nanostructures.

87 Claims, 15 Drawing Sheets

Reverse (w/o) micelle containing zinc acetate → H₂Se diffusion into water nanodomain → ZnSe nucleation and particle growth → Single ZnSe quantum dot per micelle

U.S. PATENT DOCUMENTS

| | | | |
|---|---|---|---|
| 6,274,323 | B1 | 8/2001 | Bruchez et al. |
| 6,306,610 | B1 | 10/2001 | Bawendi et al. |
| 6,306,736 | B1 | 10/2001 | Alivisatos et al. |
| 6,319,426 | B1 | 11/2001 | Bawendi et al. |
| 6,322,901 | B1 | 11/2001 | Bawendi et al. |
| 6,326,144 | B1 | 12/2001 | Bawendi et al. |
| 6,423,551 | B1 | 7/2002 | Weiss et al. |
| 6,426,513 | B1 | 7/2002 | Bawendi et al. |
| 6,440,213 | B1 | 8/2002 | Alivisatos et al. |
| 6,444,143 | B2 | 9/2002 | Bawendi et al. |
| 6,500,622 | B2 | 12/2002 | Bruchez, Jr. et al. |
| 6,501,091 | B1 | 12/2002 | Bawendi et al. |
| 6,503,382 | B1 | 1/2003 | Bartlett et al. |
| 6,576,291 | B2 | 6/2003 | Bawendi et al. |
| 6,602,671 | B1 | 8/2003 | Bawendi et al. |
| 6,607,829 | B1 | 8/2003 | Bawendi et al. |
| 6,617,583 | B1 | 9/2003 | Bawendi et al. |
| 6,630,307 | B2 | 10/2003 | Bruchez et al. |
| 6,649,138 | B2 | 11/2003 | Adams et al. |
| 6,653,080 | B2 | 11/2003 | Bruchez et al. |
| 6,682,596 | B2 | 1/2004 | Zehnder et al. |
| 6,692,660 | B2 | 2/2004 | Kumar |
| 6,696,299 | B1 | 2/2004 | Empedocles et al. |
| 6,699,723 | B1 | 3/2004 | Weiss et al. |
| 6,727,065 | B2 | 4/2004 | Weiss et al. |
| 2003/0003300 | A1 | 1/2003 | Korgel et al. |
| 2004/0007169 | A1 | 1/2004 | Ohtsu et al. |
| 2004/0072937 | A1 | 4/2004 | Tomalia et al. |
| 2004/0118698 | A1 | 6/2004 | Lu et al. |
| 2005/0006800 | A1 | 1/2005 | Mountziaris et al. |
| 2006/0240590 | A1 | 10/2006 | Mountziaris et al. |

OTHER PUBLICATIONS

Alexandridis et al., eds., *Amphiphilic Block Copolymers: Self-Assembly and Applications*, Amsterdam, The Netherlands:Elsevier Science B.V., pp. v-vi (Table of Contents) (2000).

Alexandridis & Yang, "Micellization of Polyoxyalkylene Block Copolymers in Formamide," *Macromolecules* 33(9):3382-3391 (2000).

Alexandridis et al., "A Record Nine Different Phases (Four Cubic, Two Hexagonal, and One Lamellar Lyotropic Liquid Crystalline and Two Micellar Solutions) in a Ternary Isothermal System of an Amphiphilic Block Copolymer and Selective Solvents (Water and Oil)," *Langmuir* 14(10):2627-2638 (1998).

Alexandridis et al., "Self-Assembly of Amphiphilic Block Copolymers: The $(EO)_{13}(PO)_{30}(EO)$_-Water-p-Xylene System," *Macromolecules* 28(23):7700-7710 (1995).

Alexandridis et al., "Thermodynamics of Droplet Clustering in Percolating AOT Water-in-Oil Microemulsions," *J. Phys. Chem.* 99(20):8222-8232 (1995).

Alexandridis, P., "Small-Angle Scattering Characterization of Block Copolymer Micelles and Lyotropic Liquid Crystals," *Acs Symp. Ser.* 861:60-80 (2003).

Alexandridis, P., "Structural Polymorphism of Poly(Ethylene Oxide)- Poly(Propylene Oxide) Block Copolymers in Nonaqueous Polar Solvents," *Macromolecules* 31(20):6935-6942 (1998).

Alivisatos, A.P., "Semiconductor Clusters, Nanocrystals, and Quantum Dots," *Science* 271:933-937 (1996).

Berling & Olofsson, "Solvation of Small Hydrophobic Molecules in Formamide: A Calorimetric Study," *J. Solution Chem.* 23:911-923 (1994).

Chestnoy et al., "Higher Excited Electronic States in Clusters of ZnSe, CdSe, and ZnS: Spin-Orbit, Vibronic, and Relaxation Phenomena," *J. Chem. Physics* 85(4):2237-2242 (1986).

Fendler, J.H., "Self-Assembled Nanostructured Materials," *Chem. Mater.* 8(8):1616-1624 (1996).

Gerion et al., "Synthesis and Properties of Biocompatible Water-Soluble Silica-Coated CdSe/ZnS Semiconductor Quantum Dots," *J. Phys. Chem.* 105:8861-8871 (2001).

Goldstein et al., "Melting in Semiconductor Nanocrystals," *Science* 256:1425-1427 (1992).

Hines & Guyot-Sionnest, "Bright UV-Blue Luminescent Colloidal ZnSe Nanocrystals," *J. Phys. Chem* B 102(19):3655 (1998).

Holmes et al., "Highly Luminescent Silicon Nanocrystals with Discrete Optical Transitions," *J. Am. Chem. Soc.* 123(16):3743-3748 (2001).

Imhof et al., "Stability of Nonaqueous Emulsions," *J. Colloid Interface Sci.* 192:368- 374 (1997).

Jiang et al., "Zinc Selenide Nanoribbons and Nanowires," *J. Phys. Chem.* B 108(9):2784-2787 (2004).

Karanikolos et al., "Synthesis and Size Control of Luminescent II-VI Semiconductor Nanocrystals by a Novel Microemulsion-Gas Contacting Technique," *Mater. Res. Soc. Symp. Proc.* 789:N15.55.1-N15.55.6 (2004).

Karanikolos et al., "Synthesis and Size Control of Luminescent ZnSe Nanocrystals by a Microemulsion-Gas Contacting Technique," *Langmuir* 20(3):550-553 (2004).

Karanikolos et al., "Templated Synthesis of ZnSe Nanostructures Using Lyotropic Liquid Crystals," *Nanotechnology* 16:2372-2380 (2005).

Kouklin et al., "Giant Photoresistivity and Optically Controlled Switching in Self-Assembled Nanowires," *Appl. Phys. Lett.* 79(26):4423-4425 (2001).

Kumbhojkar et al., "Quantum Confinement Effects in Chemically Grown, Stable ZnSe Nanoclusters," *NanoStruct. Mater.* 10(2):117-129 (1998).

Lehtinen et al., "Effect of Coalescence Energy Release on the Temporal Shape Evolution of Nanoparticles," *Phys. Rev.* B 63:205402-1-205402-7 (2001).

Leppert et al., "Structural and Optical Characteristics of ZnSe Nanocrystals Synthesized in the Presence of a Polymer Capping Agent," *Mater. Sci. Eng.* B 52(1):89-92 (1998).

Li et al., "Control Synthesis of Semiconductor ZnSe Quasi-Nanospheres by Reverse Micelles Soft Template," *Mater. Lett.* 59(13):1623-1626 (2005).

Li et al., "Preparation and Optical Properties of Sol-Gel Derived ZnSe Crystallites Doped in Glass Films" *J. Appl. Phys.* 75(8):4276-4278 (1994).

Lin et al., "Adsorption of a Polymeric Siloxane Surfactant on Carbon Black Particles Dispersed in Mixtures of Water with Polar Organic Solvents," *J. Colloid Interface Sci.* 255:1-9 (2002).

Lin et al., "Adsorption of a Rake-Type Siloxane Surfactant onto Carbon Black Nanoparticles Dispersed in Aqueous Media," *Langmuir* 18:6147-6158 (2002).

Lin et al., "Adsorption of Amphiphilic Copolymers on Hydrophobic Particles in Aqueous Media," *J. Disp. Sci. Tech.* 23(4):539-553 (2002).

Lin et al., "Temperature-Dependent Adsorption of Pluronic F127 Block Copolymers onto Carbon Black Particles Dispersed in Aqueous Media," *J. Phys. Chem. B* 106:10834-10844 (2002).

LV et al., "Growth and Characterization of Single-Crystal ZnSe Nanorods via Surfactant Soft-Template Method," *Solid State Commun.* 130(3-4):241-245 (2004).

Michalet et al., "Properties of Fluorescent Semiconductor Nanocrystals and Their Application to Biological Labeling," *Single Mol.* 2(4):261-276 (2001).

Murray et al., "Synthesis and Characterization of Monodisperse Nanocrystals and Close-Packed Nanocrystal Assemblies," *Annu. Rev. Mater. Sci.* 30:545-610 (2000).

Norris et al., "High-Quality Manganese-Doped ZnSe Nanocrystals," *Nano Lett.* (1):3-7 (2001).

Odian, G., "Principles of Polymerization," Third Edition, John Wiley & Sons, Inc., New York (1991) (Cover Page and Table of Contents only).

Peck et al., "Metalorganic Vapor Phase Epitaxy of $Zn_{1-x}Fe_xSe$ Films," *J. Cryst. Growth* 170(1-4):523-527 (1997).

Quinlan et al., "Reverse Micelle Synthesis and Characterization of ZnSe Nanoparticles," *Langmuir* 16(8):4049-4051 (2000).

Revaprasadu et al., "Single-Source Molecular Precursors for the Deposition of Zinc Selenide Quantum Dots," *J. Mater. Chem.* 8(8):1885-1888 (1998).

Rossetti et al., "Quantum Size Effects in the Redox Potentials, Resonance Ramam Spectra, and Electronic Spectra, and Electronic Spectra of CdS Crystallites in Aqueous Solution," *J. Chem. Phys.* 79(2):1086-1088 (1983).

Sakai & Alexandridis, "Size- and Shape-Controlled Synthesis of Colloidal Gold Through Autoreduction of the Auric Cation by Poly (Ethylene Oxide)-Poly(Propylene Oxide) Block Copolymers in Aqueous Solutions at Ambient Conditions," *Nanotechnology* 16:S344-S353 (2005).

Sarigiannis et al., "Characterization of Vapor-Phase-Grown ZnSe Nanoparticles," *Appl. Phys. Lett.* 80(21):4024-4026 (2002).

Soler-Illia et al., "Block Copolymer-Templated Mesoporous Oxides," *Curr. Opin. Colloid Interface Sci.* 8(1):109-126 (2003).

Svensson et al., "Self-Assembly of a Poly(Ethylene Oxide)/Poly(Propylene Oxide) Block Copolymer (Pluronic P104, $(EO)_{27}(PO)_{61}(EO)_{27}$) in the Presence of Water and Xylene," *J. Phys. Chem. B* 102(39):7541-7548 (1998).

Teng & Yang, "Effects of Surfactants and Synthetic Conditions on the Sizes and Self-Assembly of Monodisperse Iron Oxide Nanoparticles," *J. Mater. Chem.* 14(4):774-779 (2004).

Velev et al., "A Class of Microstructured Particles Through Colloidal Crystallization," *Science* 287:2240-2243 (2000).

Wang et al., "Synthesis and Characterization of MSe (M=Zn, Cd) Nanorods by a New Solvothermal Method," *Inorg. Chem. Commun.* 2(3):83-85 (1999).

Wong & Ying, "Amphiphilic Templating of Mesostructured Zirconium Oxide," *Chem. Mater.* 10(8):2067-2077 (1998).

Xia et al., "One-Dimensional Nanostructures: Synthesis, Characterization, and Applications," *Adv. Mater.* 15(5):353-389 (2003).

Yang et al., "Growth of CdS Nanorods in Nonionic Amphiphilic Triblock Copolymer Systems," *Chem. Mater.* 14(3):1277-1284 (2002).

Zhang et al., "Growth and Luminescence of Zinc-Blende-Structured ZnSe Nanowires by Metal-Organic Vapor Deposition," *Appl. Phys. Lett.* 83(26):5533-5535 (2003).

Zhao et al., "Preparation of CdS Nanoparticles in Salt-Induced Block Copolymer Micelles," *Langmuir* 17(26):8428-8433 (2001).

Zhao et al., "Triblock Copolymer Syntheses of Mesoporous Silica with Periodic 50 to 300 Angstrom Pores," *Science* 279:548-552 (1998).

Zhu & Bando, "Preparation and Photoluminescence of Single-Crystal Zinc Selenide Nanowires," *Chem. Phys. Lett.* 377(3-4):367-370 (2003).

Zhu et al., "General Sonochemical Method for the Preparation of Nanophasic Selenides: Synthesis of ZnSe Nanoparticles," *Chem. Mater.* 12(1):73-78 (2000).

\* cited by examiner

A  B

A  B

SYNTHESIS OF NANOSTRUCTURED MATERIALS USING LIQUID CRYSTALLINE TEMPLATES

This application claims the benefit of U.S. Provisional Patent Application Ser. No. 60/665,778 filed Mar. 28, 2005, which is hereby incorporated by reference in its entirety.

FIELD OF THE INVENTION

The present invention is directed to a process for synthesizing nanotubes, nanolaminates, hollow nanospheres, and nanostructured materials using liquid crystalline templates and for synthesizing a liquid crystalline template used in such process.

BACKGROUND OF THE INVENTION

A great variety of techniques are being used for the synthesis of nanoparticles of inorganic compounds. Most of these techniques suffer from lack of precision in controlling particle size and properties. The current state of the art in the synthesis of semiconductor nanocrystals involves the use of high temperature batch reactors. This process uses a hot coordinating solvent, such as hexadecylamine and trioctyl-phosphine, in which the reactants are injected with a syringe. Particles grow as a function of time and samples are taken at specific times to obtain populations of a certain average size. It is difficult to precisely control particle size distribution in such reactors and very difficult to isolate particles with a specific, pre-determined particle size. Using this approach, post-processing and functionalization requires many additional steps that can compromise the quality of the particles. Further, the technique cannot be scaled-up easily for industrial production.

Semiconductor nanocrystals are currently under intense investigation due to their unique, size-dependent optical and electronic properties that differ significantly from those observed in the bulk material (Rossetti et al., "Quantum Size Effects in the Redox Potentials, Resonance Ramam Spectra, and Electronic CdS Crystallites in Aqueous Solution," *J. Chem. Phys.* 79(2):1086-1088 (1983); Fendler, J. H., "Self-Assembled Nanostructured Materials," *Chem. Mater.* 8(8): 1616-1624 (1996); Murray et al., "Synthesis and Characterization of Monodisperse Nanocrystals and Close-Packed Nanocrystal Assemblies," *Annu. Rev. Mater. Sci.* 30:545-610 (2000); Alivisatos, A. P., "Semiconductor Clusters, Nanocrystals, and Quantum Dots," *Science* 271:933-937 (1996)). When at least one dimension of the nanocrystals becomes smaller than the corresponding de Broglie wavelength or Bohr radius (mean separation of an optically excited electron-hole pair), quantum confinement phenomena take place that can change the nanocrystal properties (Fendler, J. H., "Self-Assembled Nanostructured Materials," *Chem. Mater.* 8(8): 1616-1624 (1996)). Nanocrystals confining electron-hole pairs in zero dimensions (quantum dots) can exhibit size-dependent luminescence, broad excitation by any wavelength smaller than the emission wavelength, high brightness, high sensitivity, and high photostability (Murray et al., "Synthesis and Characterization of Monodisperse Nanocrystals and Close-Packed Nanocrystal Assemblies," *Annu. Rev. Mater. Sci.* 30:545-610 (2000)). Such properties make them useful for a variety of applications, including light emitting diodes, photodetectors and photovoltaics (Alivisatos, A. P., "Semiconductor Clusters, Nanocrystals, and Quantum Dots," *Science* 271:933-937 (1996)), and as fluorescent biological labels (Michalet et al., "Properties of Fluorescent Semiconductor Nanocrystals and Their Application to Biological Labeling," *Single Mol.* 2(4):261-276 (2001)). On the other hand, semiconductor nanowires and nanorods that confine electron-hole pairs in one dimension have been attracting attention for fundamental studies in mesoscopic physics and for their potential applications as interconnects and functional units in nanoelectronics (xia et al., "One-Dimensional Nanostructures: Synthesis, Characterization, and Applications," *Adv. Mater.* 15(5):353-389 (2003)).

The most common synthesis route for II-VI nanocrystals involves reactions between organometallic compounds in a trioctylphosphine ("TOP")/trioctylphosphine oxide ("TOPO") and/or hexadecylamine ("HAD") coordination solvent carried out in small batch reactors operating at ~300° C. CdSe and CdS quantum dots have been the most common materials grown by this technique (Murray et al., "Synthesis and Characterization of Nearly Monodisperse CdE (E=sulfur, selenium, tellurium) Semiconductor Nanocrystallites," *J. Am. Chem. Soc.* 115(19):8706-8715 (1993)). Luminescent ZnSe nanocrystals exhibiting high quantum yield (Hines et al., "Bright UV-Blue Luminescent Colloidal ZnSe Nanocrystals," *J. Phys. Chem. B.* 102(10):3655-3657 (1998); Revaprasadu et al., "Single-Source Molecular Precursors for the Deposition of Zinc Selenide Quantum Dots," *J. Mater. Chem.* 8:1885-1888 (1998)) and (Zn,Mn)Se diluted magnetic nanocrystals (Norris et al., "High-Quality Manganese-Doped ZnSe Nanocrystals," *Nano Lett.* 1(1):3-7 (2001)) have also been grown. To grow monodisperse nanocrystal populations the requirements include instantaneous injection and mixing of the reactants, uniform nucleation over the entire mass of the solvent, and perfect mixing during the entire process. Such conditions are difficult to achieve and selective precipitation techniques are used after synthesis to narrow down the size distribution of the nanocrystals (Murray et al., "Synthesis and Characterization of Monodisperse Nanocrystals and Close-Packed Nanocrystal Assemblies," *Annu. Rev. Mater. Sci.* 30:545-610 (2000)). Other reported techniques for growing ZnSe nanocrystals include arrested precipitation (Chestnoy et al., "Higher Excited Electronic States in Clusters of ZnSe, CdSe, and ZnS: Spin-Orbit, Vibronic, and Relaxation Phenomena," *J. Chem. Phys.* 85(4):2237-2242 (1986)), sol-gel processing (Li et al., "Preparation and Optical Properties of Sol-Gel Derived ZnSe Crystallites Doped in Glass Films," *J. Appl. Phys.* 75(8):4276-4278 (1994)), sono-chemical processing (Zhu et al., "General Sonochemical Method for the Preparation of Nanophasic Selenides: Synthesis of ZnSe Nanoparticles," *Chem. Mater.* 12(1):73-78 (2000)), growth in reverse micelles (Quinlan et al., "Reverse Micelle Synthesis and Characterization of ZnSe Nanoparticles," *Langmuir* 16(8):4049-4051 (2000)), and vapor-phase synthesis (Sarigiannis et al., "Characterization of Vapor-Phase-Grown ZnSe Nanoparticles," *Appl. Phys. Lett.* 80(21):4024-4026 (2002)).

The use of a template is typically required for growing monodisperse particle populations. Microemulsion templates have been employed for such a task. Control of particle microstructure has been achieved by colloidal crystallization in aqueous droplets suspended on the surface of a fluorinated oil (Velev et al., "A Class of Microstructured Particles Through Colloidal Crystallization," *Science* 287:2240-2243 (2000)). Monodisperse populations of Si quantum dots, with surfaces passivated by an organic monolayer, were grown by thermally degrading diphenysilane in supercritical octanol (Holmes et al., "Highly Luminescent Silicon Nanocrystals with Discrete Optical Transitions," *J. Am. Chem. Soc.* 123 (16):3743-3748 (2001)). ZnSe nanocrystals were grown in bis-2-ethylhexylsulphosuccinate sodium salt (AOT) reverse micelles by reacting zinc perchlorate hexahydrate and sodium selenide (Quinlan et al., "Reverse Micelle Synthesis and Characterization of ZnSe Nanoparticles," *Langmuir* 16(8):4049-4051 (2000)). Under ideal conditions, reverse micelles could function as identical nanoreactors, thus providing a template for precise control of particle size. In practice, the fast dynamics of droplet coalescence in water-in-oil microemulsions lead to the formation of droplet clusters and polydisperse particle populations (Zhao et al., "Preparation of CdS Nanoparticles in Salt-Induced Block Copolymer Micelles," *Langmuir* 17(26):8428-8433 (2001)).

Highly luminescent ZnSe quantum dots have been grown from diethylzinc and Se powder in a coordinating solvent of tri-η-octylphosphine (TOP) and hexadecylamine (HDA) at 270° C. (Hines et al., "Bright UV-Blue Luminescent Colloidal ZnSe Nanocrystals," *J. Phys. Chem. B* 102(19):3655 (1998)). A single-source precursor has been used to grow ZnSe quantum dots in tri-η-octylphosphine oxide (TOPO) at 250° C. (Revaprasadu et al., "Single-Source Molecular Precursors for the Deposition of Zinc Selenide Quantum Dots," *J. Mater. Chem.* 8(8):1885-1888 (1998)). Polymer capping agents have been used to encapsulate and stabilize ZnSe quantum dots grown from zinc chloride and sodium selenosulfate solutions at room temperature (Leppert et al., "Structural and Optical Characteristics of ZnSe Nanocrystals Synthesized in the Presence of a Polymer Capping Agent," *Mater. Sci. Eng. B* 52(1):89-92 (1998); Kumbhojkar et al., "Quantum Confinement Effects in Chemically Grown, Stable ZnSe Nanoclusters," *Nanostruct. Mater.* 10(2):117-129 (1998)). The as-grown quantum dot populations from the above techniques have a relatively wide size distribution that can be narrowed down by several post-processing steps including size-selective precipitation (Hines et al., "Bright UV-Blue Luminescent Colloidal ZnSe Nanocrystals," *J. Phys. Chem. B* 102(19):3655 (1998)). In an effort to grow ZnSe quantum dots and obtain narrow size distributions by use of a template, reverse micelles have been employed (Quinlan et al., "Reverse Micelle Synthesis and Characterization of ZnSe Nanoparticles," *Langmuir* 16(8):4049-4051 (2000)), but the high rate of micelle-micelle coalescence (Alexandridis et al., "Thermodynamics of Droplet Clustering in Percolating AOT Water-in-Oil Microemulsions," *J. Phys. Chem.* 99(20):8222-8232 (1995)) prevented a narrow focusing of the size distribution. Recently, one group has reported the growth of luminescent ZnSe quantum dots using a new microemulsion template that has slow droplet-droplet coalescence kinetics and thus allows the narrow focusing of the particle size distribution of the as-grown quantum dots by forming a single quantum dot per droplet (Karanikolos et al., "Synthesis and Size Control of Luminescent ZnSe Nanocrystals by a Microemulsion-Gas Contacting Technique," *Langmuir* 20(3):550-553 (2004)).

Preparation of ZnSe nanowires and nanorods with diameters of several tens of nanometres has been reported in the literature by a variety of techniques, including metal organic chemical vapour deposition (MOCVD) using colloidal Ag particles as catalyst (Zhang et al., "Growth and Luminescence of Zinc-Blende-Structured ZnSe Nanowires by Metal-Organic Vapor Deposition," *Appl. Phys. Lett.* 8(26)3:5533-5535 (2003)), solvothermal processing (Wang et al., "Synthesis and Characterization of MSe (M=Zn, Cd) Nanorods by a New Solvothermal Method," *Inorg. Chem. Commun.* 2(3):83-85 (1999)), electrodeposition inside a porous alumina film (Kouklin et al., "Giant Photoresistivity and Optically Controlled Switching in Self-Assembled Nanowires," *Appl. Phys. Lett.* 79(26):4423-4425 (2001)), laser ablation using Au as catalyst (Jiang et al., "Zinc Selenide Nanoribbons and Nanowires," *J. Phys. Chem. B* 108(9):2784-2787 (2004)), a self-catalysed vapour-liquid-solid (VLS) method (Zhu et al., "Preparation and Photoluminescence of Single-Crystal Zinc Selenide Nanowires," *Chem. Phys. Lett.* 377(3-4):367-370 (2003)), and a surfactant template method (Lv et al., "Growth and Characterization of Single-Crystal ZnSe Nanorods via Surfactant Soft-Template Method," *Solid State Commun.* 130 (3-4):241-245 (2004)).

The control of the shape and structure of nanoscale materials, like nanowires, focuses mostly on carbon nanotubes that are synthesized through a catalytic process employing metal (gold) nanoparticles as "seeds". This technique has also been used for demonstration of the synthesis of semiconductor nanowires. However, a critical issue is the poor control over nanowire size and lack of an ability to grow more complex shapes, such as bi-continuous structures, honeycombs, and the like.

Thus, there is a need for developing techniques that enable precise control of the shape, size and orientation of these materials. A variety of techniques have been reported that utilize templates or surfactant-mediated growth for controlling the size and shape of meso- and nano-scale materials. Examples include the use of amphiphilic compounds as a template for the growth of zirconium oxide with a mesostructured framework (Wong et al., "Amphiphilic Templating of Mesostructured Zirconium Oxide," *Chem. Mater.* 10(8): 2067-2077 (1998)), the surfactant-mediated growth of monodisperse iron oxide nanoparticles (Teng et al., "Effects of Surfactants and Synthetic Conditions on the Sizes and Self-Assembly of Monodisperse Iron Oxide Nanoparticles," *J. Mater. Chem.* 14(4):774-779 (2004)), the growth of colloidal crystals in aqueous droplets suspended in a fluorinated oil (Velev et al., "A Class of Microstructured Particles Through Colloidal Crystallization," *Science* 287:2240-2243 (2000)), and the synthesis of Si quantum dots by thermally degrading diphenylsilane in supercritical octanol (Holmes et al., "Highly Luminescent Silicon Nanocrystals with Discrete Optical Transitions," *J. Am. Chem. Soc.* 123(16):3743-3748 (2001)).

The present invention overcomes deficiencies in the art by employing novel templates based on amphiphilic systems that enable precise control of size, structure, shape and composition of nanostructured materials.

SUMMARY OF THE INVENTION

One aspect of the present invention relates to a process for synthesizing nanostructures. The process involves providing a first reactant in a polar phase, forming a liquid crystalline template containing the first reactant, and contacting the liquid crystalline template with a gas phase composed of a second reactant diluted in a carrier gas. The second reactant is then allowed to react with the first reactant under conditions effective to form nanostructures.

Another aspect of the present invention relates to a process for forming a liquid crystalline template. The process involves providing a block copolymer, providing a nonpolar phase, and providing a first reactant in a polar phase and allowing them to come into contact with each other, such that the polar phase is continuous and the nonpolar phase is dispersed. This is performed under conditions effective to form a liquid crystalline template.

Another aspect of the present invention relates to another process for forming a liquid crystalline template. The process involves providing a block copolymer, providing a nonpolar phase, and providing a first reactant in a polar phase and allowing them to come into contact with each other, such that the nonpolar phase is continuous and the polar phase is dispersed. This is performed under conditions effective to form a liquid crystalline template.

DETAILED DESCRIPTION OF THE INVENTION

Figure 1:
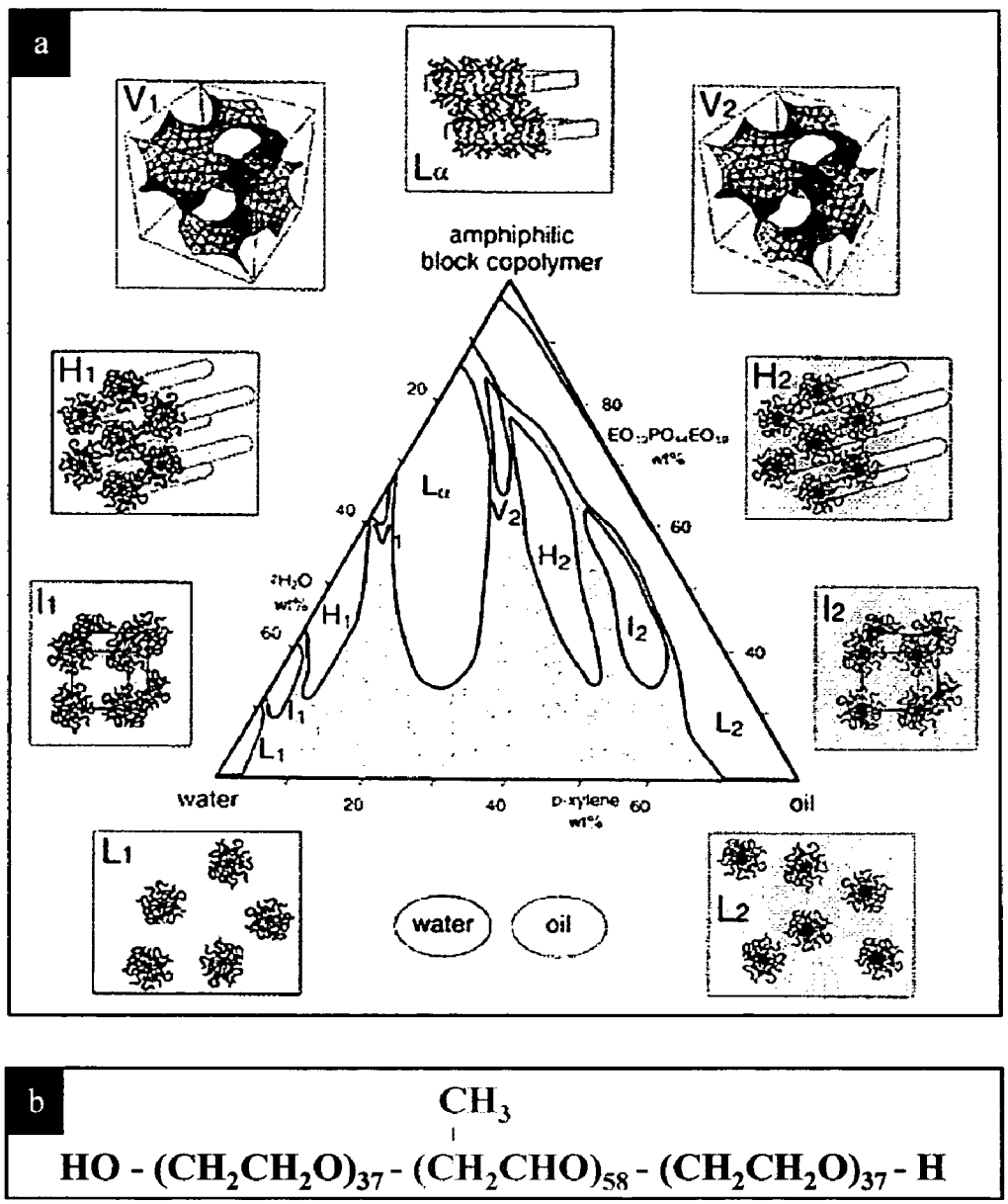
FIGS. 1A-B show a phase diagram of the PEO-PPO-PEO/water/p-xylene ternary system at 25° C.

The present invention relates to techniques for controlled synthesis of zero-, one-, and two-dimensional compound semiconductor nanostructures by using cubic, hexagonal, and lamellar lyotropic liquid crystals as templates, respectively. The liquid crystals are formed by self-assembly in a ternary system of an amphiphilic block copolymer, a non-polar phase, and a polar phase. The shape and size of the resulting nanostructures can be manipulated by selecting the templating phase of the liquid crystal, the size of the dispersed nanodomains that is controlled by the composition of the template, and the concentration of zinc acetate dihydrate in them.

The present invention employs liquid crystalline templates to achieve the controlled synthesis of nanostructures by exposing the liquid crystals to a reactive gas inside a chamber. This technology allows the synthesis of a variety of nanostructures of materials, such as compound semiconductors, oxides, magnetic semiconductors, with controllable optical, magnetic, and surface properties. Potential applications further include nanoelectronics, nanomagnetics, biomedical engineering, adaptive coatings, nanoscale honeycombed materials, high-efficiency adsorbents for gas separations, and novel catalysts.

According to the present invention, the terms liquid crystal, lyotropic liquid crystal, and liquid crystalline template have the following meanings: The term liquid crystal is used to describe a substance that exhibits a phase of matter that has properties between those of a conventional liquid, and those of a solid crystal, e.g., gel-like. For example, a liquid crystal may flow like a liquid, but have molecules in the liquid arranged and oriented in a crystal-like manner. The term lyotropic liquid crystal is used to describe a liquid crystal which exhibits phase transitions as a function of concentration of the component parts. The term liquid crystalline template is used to describe a liquid crystal which is used as a template for the formation of nanostructures.

The present invention further solves the challenging problem of simultaneously controlling size, shape, structure, and composition of nanoscale materials. It offers great flexibility in tuning the final properties of the material and in the manufacturing of the final product. In addition to "dial-a-size" capabilities, it also offers "dial-a-shape" and "dial-a-structure" capability through the self-assembled templates. It does not require any seeding to initiate the growth (seeds are impurities in the final product) and enables the growth of a great variety of materials. Finally, the process can be scaled up for industrial production.

The present invention relates to a process for synthesizing nanostructures. The process involves providing a first reactant in a polar phase, forming a liquid crystalline template containing the first reactant, and contacting the liquid crystalline template with a gas phase containing a second reactant diluted in a carrier gas. The second reactant is then allowed to react with the first reactant under conditions effective to form nanostructures.

According to the present invention, the terms nanostructure and nanoparticle are used interchangeably and refer to crystalline entities or particles at the nanometer scale, i.e., entities having at least one dimension between about 1 and about 100 nanometers.

The present invention employs lyotropic liquid-crystalline templates to control the size and shape of crystalline ZnSe nanostructures grown in the nanodomains formed by the dispersed phase. The templates are formed by self-assembly of a PEO-PPO-PEO amphiphilic block copolymer in a polar phase (e.g., water) and in the presence of a non-polar phase (e.g., p-xylene). A Zn precursor, e.g., zinc acetate dihydrate, is dissolved in the water before forming the template. By varying the composition of the ternary self-assembled system it is possible to selectively produce cubic liquid crystals with spherical nanodomains, hexagonal liquid crystals with cylindrical nanodomains, or lamellar liquid crystals with planar nanodomains, which can be used to produce nanospheres, nanotubes, or nanolaminates, respectively. For example, in order to produce a liquid crystalline template for the production of a nanotube, a cylindrical oil nanodomain of the hexagonal phase is needed, i.e., $H_1$ as shown in the ternary phase diagram of FIG. 1A. The cylindrical nanodomain template must be of the oil-in-water form, i.e., the domains must be composed of the less polar phase, e.g., p-xylene, and be surrounded by the polar phase, e.g., water, since the latter contains the first reactant for nanotube formation. Therefore, an appropriate PEO-PPO-PEO/water/p-xylene liquid crystalline template could be composed of approximately 50 wt % PEO-PPO-PEO, 35 wt % water, and 15 wt % p-xylene. Similarly, the size of the resultant nanostructure can be controlled by varying the composition of the template and/or by changing the concentration of the first reactant in the polar phase. For example, a wider nanotube may be obtained by increasing the wt % of p-xylene, therefore increasing the size of the nanodomain template. Thus, by tuning the template composition to the appropriate phase region, and by controlling the composition of the template, the shape and size of the resulting nanostructure can be precisely controlled.

The nucleation of the nanocrystals is facilitated by a spontaneous and irreversible reaction between the zinc acetate dihydrate and hydrogen selenide gas that is brought in contact with the template inside a sealed chamber and diffuses through the liquid crystal to react with zinc acetate dihydrate. By selecting the appropriate template, it is possible to control the shape and size of the resulting nanostructures, and produce ZnSe quantum dots, hallow nanospheres, nanotubes, and nanolaminates.

According to the present invention the terms first reactant and second reactant mean any element or compound capable of reacting with one another to form a nanoparticle, and suitable first and second reactants for use in the process of the present invention include any such elements or compounds.

Suitable first reactants include metal acetate compounds. Exemplary metals include, without limitation, Zn, Cd, Hg, Pb, Mn, and Fe. Another example of a suitable first reactant includes a metal acetate dihydrate compound. Exemplary metal acetate compounds include, without limitation, Zn acetate, Cd acetate, Hg acetate, Pb acetate, Mn acetate, and Fe acetate. Preferably, the metal acetate compound is Zn acetate, and more preferably Zn acetate dihydrate.

According to the present invention, the liquid crystalline template is formed by providing a block copolymer, providing a nonpolar phase, and allowing the block copolymer, nonpolar phase, and first reactant in a polar phase to come into contact with each other under conditions effective to form the liquid crystalline template.

According to the present invention, conditions which affect the formation of the liquid crystalline template include temperature, pressure, and concentration of the block copolymer, nonpolar phase, and first reactant in a polar phase. The formation of a liquid crystalline template is preferably performed between about 5° C. and about 50° C. and between about 1.0 and about 2.0 atmospheres of pressure, or any other temperature and pressure at which the liquid crystalline template is stable. The concentration of the block copolymer preferably ranges between about 30 wt % and about 80 wt %, the concentration of the nonpolar phase preferably ranges between about 0 wt % and about 50 wt % and the concentration of the first reactant in the polar phase preferably ranges between about 0.001 M to about 2.0 M, or any concentration at which the liquid crystallaine template is stable. The relative concentration of each of these components determines the shape and size of the liquid crystalline template, thus the shape and size of the resultant nanostructure, as described above according to the present invention.

In one preferred embodiment, the polar phase is continuous, the nonpolar phase is dispersed and the block copolymer is composed of poly (ethylene oxide) and poly (propylene oxide). According to this aspect of the present invention, the polar continuous phase is a non-reactive polar solvent, preferably water, and the non polar dispersed phase is an organic solvent, which can be an alkene, and is preferably p-xylene.

In another preferred embodiment, the nonpolar phase is continuous, the polar phase is dispersed and the block copolymer is composed of poly (ethylene oxide) and poly (propylene oxide). According to this aspect of the present invention, the polar dispersed phase is a non-reactive polar solvent, preferably water, and the nonpolar continuous phase is an organic solvent, which can be an alkene, and is preferably p-xylene.

In each of these preferred embodiments, the designation of the nonpolar phase or polar phase as continuous is generally determined by their respective concentrations, i.e., when the polar phase is present in higher concentrations than the nonpolar phase, the nonpolar phase will be dispersed in the continuous polar phase. Similarly, the designation of the nonpolar phase or polar phase as dispersed is generally determined by their respective concentrations, i.e., when the nonpolar phase is present in higher concentrations than the polar phase, the polar phase will be dispersed in the continuous nonpolar phase. However, depending on the properties of the block copolymer, in certain situations a phase can be continuous although it is present in a lower concentration than the other phase. In these situations, a particular phase is designated as continuous when it is outside the template nanodomains and dispersed when the phase is within the template nanodomains.

The liquid crystalline templates were prepared by mixing specific amounts of PEO-PPO-PEO block copolymer with p-xylene (p-$C_8H_{10}$) as the less polar phase and a 1 M solution of zinc acetate dihydrate ($Zn(C_2H_3O_2)_2.2H_2O$) in water ($H_2O$) as the polar phase. PPO is the p-xylene-soluble block and PEO is the water-soluble block. The samples were centrifuged repeatedly in alternating directions over the course of several days to facilitate homogenization. The total mass of each sample was 0.5 g, and formed a layer with thickness of approximately 1 mm in each vial. To perform nanocrystal synthesis, the liquid crystals were placed in a chamber and brought into contact with a mixture of 5% hydrogen selenide ($H_2Se$) gas in hydrogen ($H_2$) for 6 hours at room temperature and atmospheric pressure.

A number of poly(ethylene oxide)-poly(propylene oxide)-poly(ethylene oxide) (PEO-PPO-PEO) triblock copolymers have been identified, which self-assemble under equilibrium conditions into a variety of lyotropic liquid crystalline microstructures having spherical, cylindrical, or planar domains or having an interconnected (bicontinuous) topology. Such an ability to form several 'normal' (oil-in-water) and 'reverse' (water-in-oil) structures at the same temperature has never before been observed in ternary systems of common surfactants with water and oil. Furthermore, the variety of structures formed by a PEO-PPO block copolymer in the presence of selective solvents is much greater than that of a block copolymer of a given block composition in the absence of solvents or even in the presence of homopolymers (Alexandridis et al., "A Record Nine Different Phases (Four Cubic, Two Hexagonal, and One Lamellar Lyotropic Liquid Crystalline and Two Micellar Solutions) in a Ternary Isothermal System of an Amphiphilic Block Copolymer and Selective Solvents (Water and Oil)," *Langmuir* 14(10):2627-2638 (1998), which is hereby incorporated by reference in its entirety). The excellent properties of PEO-PPO block copolymers as templates have been demonstrated for synthesis of mesoporous materials (Zhao et al., "Triblock Copolymer Syntheses of Mesoporous Silica with Periodic 50 to 300 Angstrom Pores," *Science* 279:548-552 (1998); Soler-Illia et al., "Block Copolymer-Templated Mesoporous Oxides," *Curr. Opin. Colloid Interface Sci.* 8(1):109-126 (2003), which are hereby incorporated by reference in their entirety) and metal nanostructures (Sakai et al., "Size- and Shape-Controlled Synthesis of Colloidal Gold Through Autoreduction of the Auric Cation by Poly (Ethylene Oxide)-Poly(Propylene Oxide) Block Copolymers in Aqueous Solutions at Ambient Conditions," *Nanotechnology* 16:S344-S353 (2005), which is hereby incorporated by reference in its entirety), preparation of CdS nanorods (Yang et al., "Growth of CdS Nanorods in Nonionic Amphiphilic Triblock Copolymer Systems," *Chem. Mater.* 14(3): 1277-1284 (2002), which is hereby incorporated by reference in its entirety), and growth of ZnSe quantum dots (Karanikolos et al., "Synthesis and Size Control of Luminescent ZnSe Nanocrystals by a Microemulsion-Gas Contacting Technique,"

*Langmuir* 20(3):550-553 (2004), which is hereby incorporated by reference in its entirety).

Examples of block copolymers include, without limitation, copolymers made by joining poly(ethylene oxide) or poly (acrylic acid) blocks with polystyrene or polybutylene or polydimethylsiloxane. An exemplary block copolymer includes a poly(ethylene oxide)-poly(propylene oxide)-poly (ethylene oxide) block copolymer. Exemplary surfactants for use in the present invention are natural (e.g., lipids), synthetic (e.g., alkyl benzyl sulfonates), ionic (e.g., sodium dodecyl sulfate), cationic (e.g., alkyl-trimethylammonium chloride), nonionic (e.g., alkyl ethoxylates), or zwitterionic (e.g. betaine). The surfactants can include single species (e.g., one type of molecule present) or mixtures of species (e.g., mixture of anionic and cationic surfactants, mixture of an ionic surfactant and an aliphatic alcohol). The surfactants can also be monodisperse or polydisperse. Examples of suitable water-dispersible polymers include dextran, guar gum, and gelatine. Examples of suitable solid particles for use in the present invention include silica, aluminum oxide, and titanium oxide. Suitable solvent-swollen particles include latexes.

Triblock copolymers composed of two water-soluble PEO groups, and one water-insoluble PPO group, the structure of which is shown in FIG. 1B, are amphiphilic, i.e., in the presence of water and oil they self-assemble into a variety of thermodynamically stable microstructures including spherical, cylindrical, or planar microdomains, or having an interconnected (bicontinuous) topology. Examples of these microstructures include normal (oil-in-water) micelles in solution, various normal and reverse (water-in-oil) lyotropic liquid crystals (normal micellar cubic, normal hexagonal, normal bicontinuous cubic, lamellar, reverse bicontinuous cubic, reverse hexagonal, reverse micellar cubic), and reverse micelles. The microstructure progresses from a normal to a reverse micelle as the volume fraction of the nonpolar ("oil"-like) components increases relative to that of the polar ("water"-like) components (FIG. 1A) (Alexandridis et al., "A Record Nine Different Phases (Four Cubic, Two Hexagonal, and One Lamellar Lyotropic Liquid Crystalline and Two Micellar Solutions) in a Ternary Isothermal System of an Amphiphilic Block Copolymer and Selective Solvents (Water and Oil)," *Langmuir* 14:2627-2638 (1998); Alexandridis et al., "Self-Assembly of Amphiphilic Block Copolymers: The (EO)13(PO)30(EO)13-Water-p-Xylene System," *Macromolecules* 28:7700-7710 (1995); Alexandridis et al., "Solvent-Regulated Ordering in Block Copolymers," *Curr. Opin. Colloid Interface Sci.* 4:130-139 (1999), which are hereby incorporated by reference in their entirety). The formation of both normal and reverse structures at the same temperature is unique to the PEO-PPO copolymer system, and has never been observed in analogous ternary systems composed of common surfactants with water and oil. Furthermore, the variety of structures formed by a PEO-PPO block copolymer in the presence of polar and nonpolar solvents is large compared to the limited number of structures produced in the absence of solvents or in the presence of homopolymers (Alexandridis et al., "A Record Nine Different Phases (Four Cubic, Two Hexagonal, and One Lamellar Lyotropic Liquid Crystalline and Two Micellar Solutions) in a Ternary Isothermal System of an Amphiphilic Block Copolymer and Selective Solvents (Water and Oil)," *Langmuir* 14:2627-2638 (1998); Alexandridis et al., "Self-Assembly of Amphiphilic Block Copolymers: The (EO)13(PO)30(EO)13-Water-p-Xylene System," *Macromolecules* 28:7700-7710 (1995); Alexandridis et al., "Solvent-Regulated Ordering in Block Copolymers," *Curr. Opin. Colloid Interface Sci.* 4:130-139 (1999), which are hereby incorporated by reference in their entirety). PEO-PPO-PEO block copolymers are excellent surfactant templates for the synthesis of mesoporous materials (Zhao et al., "Triblock Copolymer Syntheses of Mesoporous Silica with Periodic 50 to 300 Angstrom Pores," *Science* 279:548-552 (1998); Soler-Illia et al., "Block Copolymer-Templated Mesoporous Oxides," *Curr. Opin. Colloid Interface Sci.* 8(1):109-126 (2003), which are hereby incorporated by reference in their entirety) and metal nanoparticles (Sakai et al., "Single-Step Synthesis and Stabilization of Metal Nanoparticles in Aqueous Pluronic Block Copolymer Solutions at Ambient Temperature," *Langmuir* 20:8426-8430 (2004); Zhang et al., "Recovery of Nanoparticles from $(EO)_8(PO)_{50}(EO)_8$/p-Xylene/$H_2O$ Microemulsions by Tuning the Temperature," *Langmuir* 19:8611-8614 (2003); Zhang et al., "Organic Reactions and Nanoparticle Preparation in $CO_2$-Induced Water/P104/p-Xylene Microemulsions," *Chem.-Eur. J.* 9:2167-2172 (2003), which are hereby incorporated by reference in their entirety), the preparation of CdS nanorods (Yang et al., "Growth of CdS Nanorods in Nonionic Amphiphilic Triblock Copolymer Systems," *Chem. Mater.* 14(3):1277-1284 (2002), which is hereby incorporated by reference in its entirety), and the growth of ZnSe nanocrystals (Karanikolos et al., "Synthesis and Size Control of Luminescent ZnSe Nanocrystals by a Microemulsion-Gas Contacting Technique," *Langmuir* 20(3):550-553 (2004); Karanikolos et al., "Synthesis and Size Control of Luminescent II-VI Semiconductor Nanocrystals by a Novel Microemulsion-Gas Contacting Technique," *Mater. Res. Soc. Symp. Proc.* 789:389 (2004), which are hereby incorporated by reference in their entirety).

Generally, liquid crystalline template samples were prepared inside flame-sealed glass tubes to avoid solvent evaporation, and were homogenized by repeated centrifugation over the course of several days. At equilibrium, the single-phase samples were clear and macroscopically homogeneous, whereas the two-phase samples were either homogeneous but opaque, or macroscopically heterogeneous/phase separated. Under polarized light, the microemulsion solution and cubic lyotropic liquid crystal samples were isotropic, while hexagonal and lamellar lyotropic liquid crystal samples were anisotropic/birefringent (Alexandridis et al., "A Record Nine Different Phases (Four Cubic, Two Hexagonal, and One Lamellar Lyotropic Liquid Crystalline and Two Micellar Solutions) in a Ternary Isothermal System of an Amphiphilic Block Copolymer and Selective Solvents (Water and Oil)," *Langmuir* 14(10):2627-2638 (1998); Alexandridis, P., "Structural Polymorphism of Poly(Ethylene Oxide)-Poly (Propylene Oxide) Block Copolymers in Nonaqueous Polar Solvents," *Macromolecules* 31(20):6935-6942 (1998), each of which are hereby incorporated by reference in their entirety). Easy distinction between microemulsion solution and cubic liquid crystal samples was likely due to the fact that the former can easily flow, whereas the latter are gel-like. Thus, using the ternary phase diagram of FIG. 1, it is possible to identify the relative amounts of the three components for forming the liquid crystalline templates of interest.

Templated growth of ZnSe nanostructures is performed using a PEO-PPO-PEO/water/p-xylene self-assembled ternary system, which forms lyotropic liquid crystalline microstructures composed of spherical, cylindrical, and planar nanodomains. The ZnSe nanomaterial is formed through contact between zinc acetate dihydrate, which is dissolved in the water nanodomains, and hydrogen selenide gas that is allowed to diffuse through the template. In addition to quantum dots grown in the dispersed spherical nanodomains of reverse liquid crystals, also demonstrated is the synthesis of the following nanostructures: hollow spheres around the dispersed spherical nanodomains of the normal cubic phase, hollow tubes around the cylindrical oil nanodomains of the hexagonal phase, and free-standing quantum wells (nanoplates or nanolaminates) in lamellar liquid crystals. This is likely the first reported synthesis of ZnSe nanotubes.

According to the present invention, the shape of resulting ZnSe nanostructures can be controlled by tuning the template composition to the appropriate phase region whereas their size can be controlled by changing either the composition of the template in a given phase region, to change the size of the nanodomains, or by manipulating the concentration of the initial aqueous solution of Zn precursor. The production of an appropriate template for the synthesis of a specific nanostructure is described above according to the present invention. In addition to the ability to control the shape and size of the resultant nanostructure by controlling the template composition, the size can also be controlled by changing the concentration of the first reactant, i.e., Zn acetate dihydrate. For example, if a thicker nanotube is desired, one may increase the concentration of Zn acetate dihydrate in the polar phase. Preferable Zn acetate dihydrate concentrations range from about 0.001 M to about 2.0 M, or any other concentration at which the liquid crystalline template is stable. Thus, by tuning the template composition to the appropriate phase region and by controlling the composition of the template and changing the concentration of the Zn precursor, the shape and size of the resulting nanostructure can be precisely controlled.

Suitable second reactants can be in the form of a gas or vapor, i.e., a gas phase. A particular suitable second reactant includes, for example, a Group VI element-containing compound. Exemplary Group VI elements include, without limitation, Se, S, Te, and O. In one embodiment, the second reactant is a Group VI element-containing compound in the form of a hydride (e.g., a hydride of Se, S, or Te). More particularly, the second reactant is $H_2Se$ gas. In another embodiment, the second reactant is an oxygen-containing compound. Exemplary oxygen-containing compounds include, without limitation, molecular oxygen ($O_2$) gas, ozone ($O_3$) gas, or water ($H_2O$) vapor. In yet another embodiment, the second rectant is a Te-containing compound. Exemplary Te-containing compounds include, without limitation, vapors of dimethyl-Te, diethyl-Te, or diisopropyl-Te.

Suitable carrier gases for use in the present invention include any gas which can contain the second reactant and that does not react with either of the first reactant, the second reactant, the liquid crystal, or a product of the processes of the present invention. Exemplary carrier gases include, without limitation, hydrogen, nitrogen, helium, and argon.

According to the present invention, the contacting step encompasses bubbling the gas phase over the liquid crystalline template under conditions effective to allow the second reactant to diffuse into the template and to react with the first reactant, thus forming the nanostructures. Preferably, contacting is performed between about 5° C. and about 50° C., or at any other temperature at which the liquid crystal is stable at atmospheric pressure or at a pressure higher than atmospheric pressure.

Figure 2:
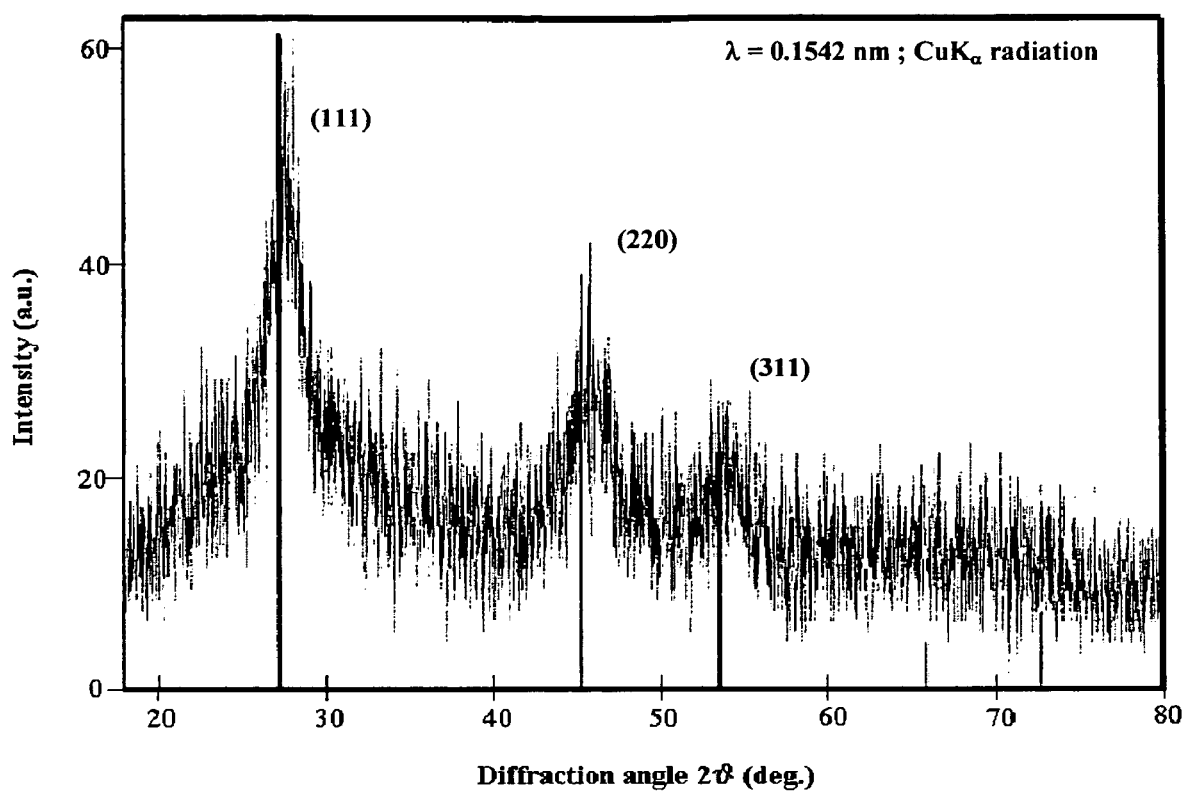
FIG. 2 shows the X-ray diffraction pattern from ZnSe particle aggregates obtained by reacting zinc acetate dihydrate (diluted in water) with $H_2Se$ gas (as a mixture with $H_2$) at room temperature.

To investigate the feasibility of the proposed chemistry for room-temperature synthesis of crystalline ZnSe, without using liquid crystalline templates according to the present invention, a 5% hydrogen selenide/hydrogen gas mixture was bubbled through a 0.01 M solution of zinc acetate dihydrate in water at room temperature and atmospheric pressure. This produced a suspension of ZnSe particle aggregates in water. Samples taken from the suspension were placed on clean quartz wafers and the water was evaporated under vacuum. The resulting deposits of ZnSe particles on quartz were analyzed by x-ray diffraction. The diffraction peaks, shown in FIG. 2, match the standard peaks corresponding to cubic (zinc blende) ZnSe, confirming that the reaction does yield crystalline ZnSe at room temperature. The vertical lines at 27.2°, 45.2°, and 53.6° correspond to the standard diffraction angles from (111), (220), and (311) planes of cubic (zinc blende) ZnSe. This initial work confirmed the feasibility of room temperature synthesis of crystalline ZnSe.

According to the proposed growth mechanism, nucleation of ZnSe clusters takes place through a direct and spontaneous reaction between zinc acetate dihydrate, which is dissolved in the water phase of the liquid crystal, and $H_2Se$ gas that comes into contact with the template. The ZnSe clusters subsequently grow by surface reactions, and by cluster-cluster coalescence, to eventually form a single nanostructure in each water nanodomain.

The formation of single-crystalline nanostructures by the methods of the present invention (and other room-temperature techniques (Ma et al., "Facile Synthesis of Hollow ZnS Nanospheres in Block Copolymer Solutions," *Langmuir* 19:4040-4042 (2003); Karanikolos et al., "Synthesis and Size Control of Luminescent ZnSe Nanocrystals by a Microemulsion-Gas Contacting Technique," *Langmuir* 20(3):550-553 (2004); Sarigiannis et al., "Characterization of Vapor-Phase-Grown ZnSe Nanoparticles," *Appl. Phys. Lett.* 80(21):4024-4026 (2002); Sarigiannidis et al., "Vapor-Phase Synthesis and Surface Functionalization of ZnSe Nanoparticles in a Counterflow Jet Reactor," *Mater. Res. Soc. Symp. Proc.* 789:383-388 (2004); Quinlan et al., "Reverse Micelle Synthesis and Characterization of ZnSe Nanoparticles," *Langmuir* 16(8): 4049-4051 (2000), which is hereby incorporated by reference in its entirety) most likely occurs via an annealing mechanism as a result of the energy released by the coalescence of small nanocrystals and clusters to form the final particle (Lehtinen et al., "Effect of Coalescence Energy Release on the Temporal Shape Evolution of Nanoparticles," *Phys. Rev.* B 63:205402-205409 (2001), which is hereby incorporated by reference in its entirety). The energy released is due to the minimization of the unsaturated surface bonds. The annealing is aided by a reported depression of the melting point with particle size, which is expected to be similar to the melting point depression reported for CdS nanocrystals (Goldstein et al., "Melting in Semiconductor Nanocrystals," *Science* 256:1425-1427 (1992), which is hereby incorporated by reference in its entirety). Due to the melting point depression, the annealing can proceed at much lower temperatures than the ones required for annealing of bulk crystals. Modeling of thermal effects during cluster and nanocrystal coalescence in the templates discussed here indicates that the energy release during coalescence is sufficient to locally raise the temperature of the resulting nanocrystals to enable annealing, before energy dissipation by conduction to the surrounding medium can cool the nanocrystals back to room temperature (Kostova et al., "Multi-Scale Models of the Synthesis of Compound Semiconductor Nanocrystals (Quantum Dots) Using Microemulsions as Templates," *AIChE Annual Mtg (Austin, Tex., November* 2004) paper 590 g (manuscript in preparation) (2005), which is hereby incorporated by reference in its entirety). The net energy released during this process is very small so that, macroscopically, the temperature of the system remains at room temperature.

The synthesis of ZnSe quantum dots, ZnSe hollow nanospheres, ZnSe nanotubes, and ZnSe nanolaminates was performed using liquid crystalline templates, synthesized according to the present invention, containing either water in a p-xylene continuous phase or p-xylene in a water continuous phase.

Figure 3:
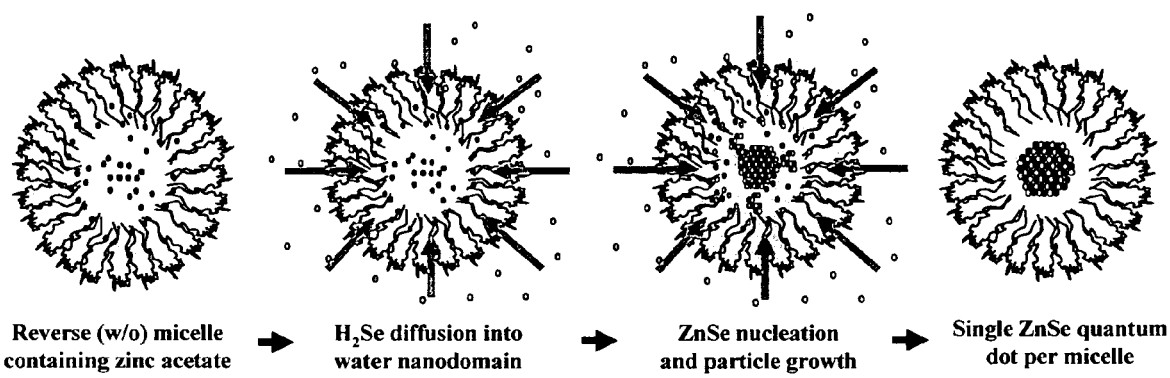
FIG. 3 illustrates the mechanism of formation of ZnSe quantum dots.

The mechanism of ZnSe quantum dot formation in liquid crystals is shown schematically in FIG. 3. ZnSe quantum dots were formed inside the water spherical nanodomains of the reverse liquid crystalline region of the PEO-PPO-PEO/water/p-xylene ternary system that contained zinc acetate dihydrate.

Figure 6:
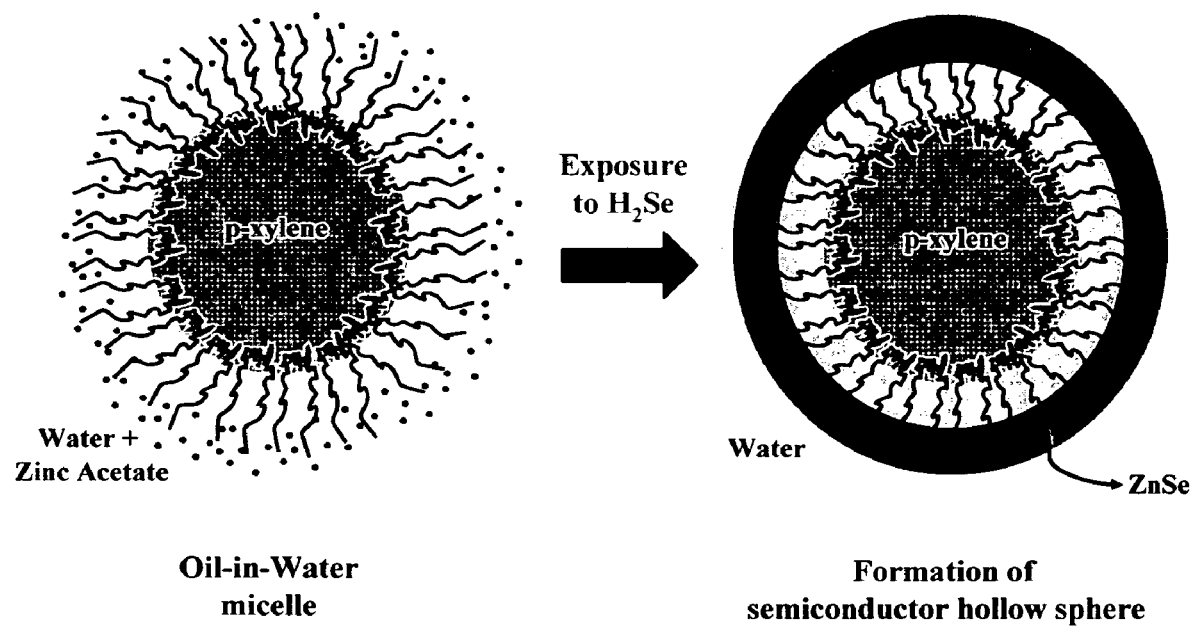
FIG. 6 illustrates the mechanism of formation of ZnSe hollow nanospheres.

The mechanism of ZnSe hollow nanosphere formation in liquid crystals is shown schematically in FIG. 6. ZnSe hollow nanospheres were synthesized in normal (oil-in-water) micellar liquid crystalline templates of the PEO-PPO-PEO/water/p-xylene ternary system. At equilibrium, zinc acetate dihydrate is uniformly distributed in the water phase of the liquid crystal around the spherical oil nanodomains, and converts to ZnSe after exposure to $H_2Se$ gas.

Figure 8:
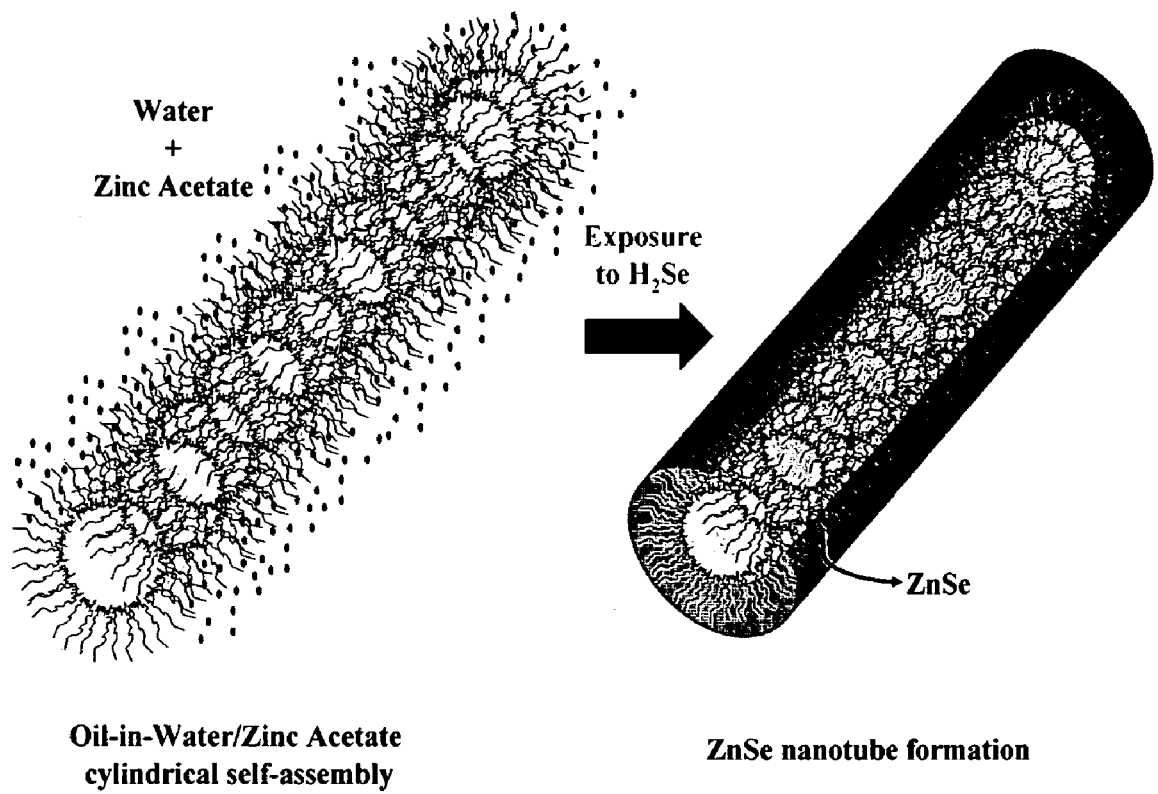
FIG. 8 illustrates the mechanism of formation of ZnSe nanotubes.

The mechanism of ZnSe nanotube formation in liquid crystals is shown schematically in FIG. 8. Cylindrical nanodomains of the normal liquid crystalline region of the PEO-PPO-PEO/water/p-xylene ternary system were used to template the growth of ZnSe nanotubes. The block copolymer in this phase region self-assembles into uniform nanocylinders containing p-xylene, whereas water containing zinc acetate dihydrate is kept outside due to its different polarity. A continuous ZnSe layer grows in the aqueous phase and acquires the cylindrical shape of the template.

Figure 12:
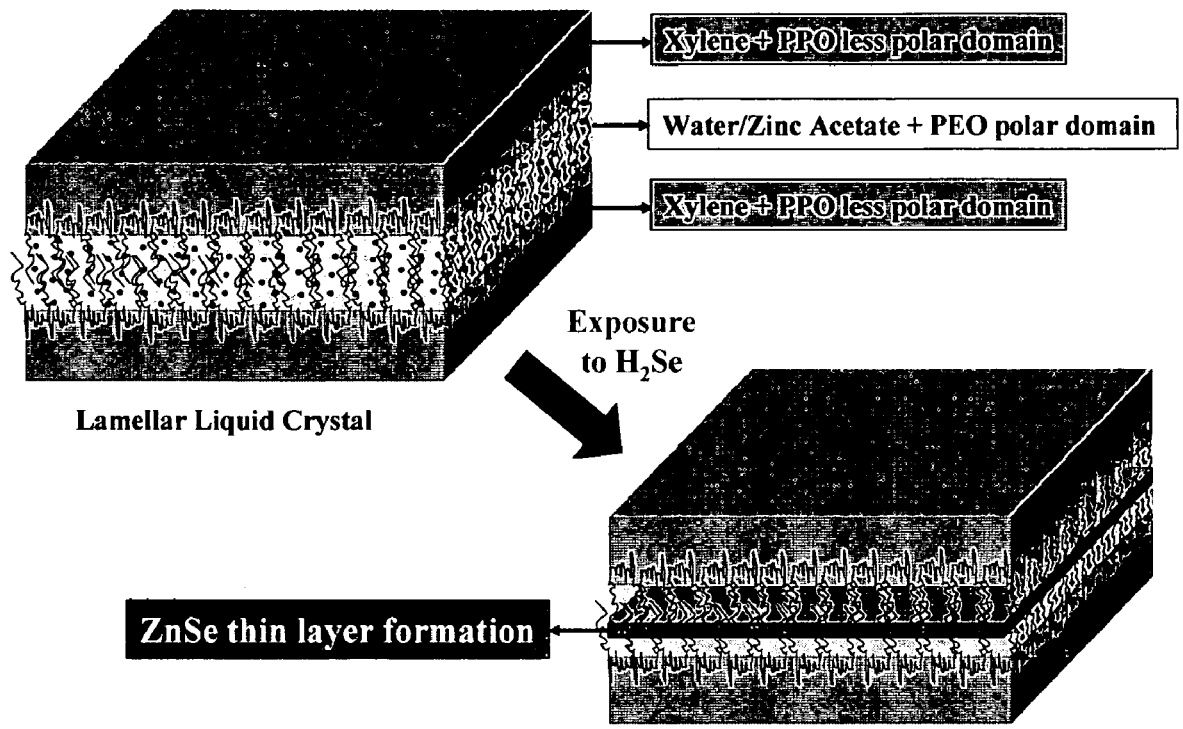
FIG. 12 illustrates the mechanism of formation of ZnSe nanolaminates.

The mechanism of ZnSe nanolaminate formation in liquid crystals is shown schematically in FIG. 12. ZnSe nanolaminates were grown inside the self-assembled planar water nanodomains of the lamellar phase of the PEO-PPO-PEO/water/p-xylene ternary system. The lamellar phase is made of alternating polar (water+PEO) and non-polar (p-xylene+PPO) layers, with a 7 nm average thickness of the polar domain as determined by small-angle x-ray scattering (SAXS) (Svensson et al., "Self-Assembly of a Poly(Ethylene Oxide)/Poly(Propylene Oxide) Block Copolymer (Pluronic P 104, $(EO)_{27}(PO)_{61}(EO)_{27}$) in the Presence of Water and Xylene," *J. Phys. Chem.* B 102(39):7541-7548 (1998), which is hereby incorporated by reference in its entirety).

According to the present invention, the nanostructures which are produced can be nanoparticles having a diameter of between about 1 and about 100 nanometers. In addition, the nanoparticles produced by the processes of the present invention can be of various forms, including, for example, nanoparticles of crystalline form, polycrystalline form, or amorphous form. In one embodiment, the nanoparticles are nanocrystals. In particular, the nanoparticles can be single crystals that exhibit long-range order of the atoms contained in each nanoparticle that extend continuously over the entire mass of the nanoparticle. The nanoparticles can also be polycrystalline particles, including particles composed of sintered single-crystalline grains (Sarigiannis et al., "Characterization of Vapor-Phase-Grown ZnSe Nanoparticles," *Appl. Phys. Lett.* 80(21):4024-4026 (2002), which is hereby incorporated by reference in its entirety). Further, the nanoparticles can be amorphous particles exhibiting no long-range order of the atoms that form them. The shape of the individual particles can be arbitrary, for example, spherical, or rod-like. However, the individual particles can also have other shapes such as dumbbells, discs, or aggregates of smaller particles that form dendrite-like structures.

The nanoparticles produced by the process of the present invention can have various attributes. For example, the nanoparticles can exhibit size-dependent luminescence and/or fluorescence. The nanoparticles can also be of various compositions. For example, the nanocrystals can be luminescent Group II-Group VI nanocrystals of the form MX, where M is Zn, Cd, or Hg, and where X is Se, S, Te, or O. More particularly, the nanocrystals can include, for example, ZnSe, ZnS, ZnTe, CdSe, CdS, CdTe, PbSe, and PbS nanocrystals. In a specific embodiment, the nanocrystals are ZnSe or CdSe nanocrystals having a diameter of between about 1 and about 200 nanometers.

ZnSe is a direct band gap semiconductor with a band gap of 2.7 eV at room temperature, which makes it suitable for the fabrication of short wavelength devices such as blue-green lasers, photodetectors, and light-emitting diodes.

The processes of synthesizing nanostructures according to the present invention further include incorporating a functional material onto the surface of the nanostructure. A functional material, as used herein, means any compound or component that can be added to a nanostructure in order to affect the nanostructure's final properties. This functional material can be dissolved in a solvent prior to the contacting step of the synthesizing process, can be added to the inner or outer surface of the nanoparticle, and can include either a thiol-based compound or an amine-based compound. Suitable solvents include aliphatic hydrocarbons including heptane and octane. Additional suitable solvents include aromatic hydrocarbons including p-xylene and toluene.

In addition to producing monodisperse assemblies of nanocrystals, the process of the present invention can be used to simplify the functionalization of nanocrystals. Hybrid nanocrystal-polymer composites can be synthesized by adding polymerizable surface ligands in the dispersed phase. For example, 4-thiomethyl styrene can serve both as a capping agent for the nanocrystals and as a co-monomer in the polymerization of styrene, after the particles have been dispersed in it. This can allow for the synthesis of photonic materials having nanocrystals as the building blocks (active centers) in a polymer matrix composed of macromolecular tethers between the nanocrystals.

Using the process of the present invention, a class of functional materials, inorganic-organic composite nanocrystals including a semiconductor core and a polymer corona, can be developed by a number of synthesis routes. These synthesis routes can include, for example, the following: (a) the nanocrystal surface can be capped with thiols possessing a reactive end-group, which can be used to attach or grow a polymer chain; (b) the nanocrystal surface can be coated with silicon oxide, and well-established silane chemistry can be used to chemically attach polymers (Gerion et al., "Synthesis and Properties of Biocompatible Water-Soluble Silica-Coated CdSe/ZnS Semiconductor Quantum Dots," *J. Phys. Chem.* B. 105:8861-8871 (2001), which is hereby incorporated by reference in its entirety); and (c) the nanocrystals can be placed in the dispersed phase of a suspension polymerization process (Odian, G., "Principles of Polymerization," Wiley, $3^{rd}$ ed. (1991), which is hereby incorporated by reference in its entirety) and the monomer allowed to polymerize around them, producing latex beads containing several nanocrystals.

Alternatively, an initiator can be attached to the nanocrystals, followed by emulsion polymerization, resulting in a single polymer chain coating a single nanocrystal. In addition to the above "chemical" approaches, "physical" binding of polymers to nanocrystals can occur upon suspension in a solvent containing dissolved high-molecular weight polymer. Following polymer adsorption (Lin et al., "Adsorption of a Rake-Type Siloxane Surfactant Onto Carbon Black Nanoparticles Dispersed in Aqueous Media," *Langmuir* 18:6147-6158 (2002); Lin et al., "Adsorption Properties of a Polymeric Siloxane Surfactant Onto Carbon Black Particles Dispersed in Mixtures of Water With Polar Solvents," *J. Colloid Interface Sci.* 255:1-9 (2000); Lin et al., "Adsorptoin of Amphiphilic Copolymers on Hydrophobic Particles in Aqueous Media," *J. Disp. Sci. Tech.* 23:539-553 (2002); Lin et al., "Temperature-Dependent Adsorption of Pluronic F127 Block Copolymers Onto Carbon Black Particles Dispersed in Aqueous Media," *J. Phys. Chem.* B. 106:10834-10844 (2002), each of which are hereby incorporated by reference in their entirety) on the nanocrystals and the removal of the solvent by spray drying, porous polymer particles, each containing many ZnSe nanocrystals, can be obtained. Alternatively, the precipitation of the polymer on the particle surface, following a worsening of the solvent quality, can result in a suspension of polymer-coated ZnSe nanocrystals.

The process of synthesizing nanostructures according to the present invention further includes isolating the nanoparticles which can be substantially the same size and will be dependent on the initial concentration of the first reactant prior to the contacting step of the synthesizing process.

According to the present invention, one preferable method for synthesizing hallow nanostructures includes combining together 67 wt % zinc acetate dihydrate, 31 wt % poly (ethylene oxide) and poly (propylene oxide), and 2 wt % p-xylene, thereby forming a "xylene-in-water" liquid crystalline template. $H_2Se$ gas is then diffused into the liquid crystalline template where zinc acetate dihydrate reacts with $H_2Se$ to form hollow ZnSe nanostructures.

According to the present invention, one preferable method for synthesizing solid nanostructures involves combining together 10 wt % zinc acetate dihydrate, 58 wt % poly (ethylene oxide) and poly (propylene oxide), and 32 wt % p-xylene, thereby forming a "water-in-xylene" liquid crystalline template. $H_2Se$ gas is then diffused into the liquid crystalline template where zinc acetate dihydrate reacts with $H_2Se$ to form hollow ZnSe nanostructures.

The present invention also relates to a liquid crystalline template produced by providing a block copolymer, providing a nonpolar phase, and providing a first reactant in a polar phase. The materials are then allowed to come into contact with each other, such that the polar phase is continuous and the nonpolar phase is dispersed, i.e., "oil-in-water", under conditions effective to form the liquid crystalline template. Alternatively, the materials are allowed to come into contact with each other, such that the nonpolar phase is continuous and the polar phase is dispersed, i.e., "water-in-oil", under conditions effective to form the liquid crystalline template. The conditions effective in forming the liquid crystalline template are temperature, pressure, and concentration, as described above according to the present invention.

The block copolymer is made of, although not limited to, poly (ethylene oxide) and poly (propylene oxide), as described according to the present invention.

Suitable polar phases include, but are not limited to, any polar solvent that does not react with either of the first reactant, the second reactant, the liquid crystal, or a product of the processes of the present invention, as described according to the present invention. One preferred polar phase is water.

Suitable non-polar phases include, but are not limited to, an organic solvent, an alkene, and preferably p-xylene, as described according to the present invention.

The process for forming the liquid crystalline templates is performed between about 5° C. and about 50° C. and between about 1.0 and about 2.0 atmospheres of pressure, or at any other temperature or pressure at which the liquid crystalline template is stable.

According to these aspects of the present invention, suitable first reactants and second reactants for use in the process of the present invention include any elements or compounds that are capable of reacting with one another to form a nanoparticle, as described according to the present invention.

Structural, morphological, and chemical characterization of the nanocrystals, nanoparticles, and nanstructures of the present invention, can be performed by using transmission electron microscopy (TEM), atomic force microscopy (AFM), energy dispersive analysis of X-rays, and optical spectroscopy (Raman, transmission and photoluminescence). By measuring the effective band gap of these materials using transmission spectroscopy, the increase in gap with decreasing nanoparticle size and the variation of bandgap with composition in ternary materials can be precisely recorded. The characterization of DMS nanocrystals and the corresponding polymer-nanocrystal hybrids focus on measurements of magneto-optical effects by applying a variable external magnetic field. An 8-Tesla superconducting magnet with a Janis optical cryostat can be used. Characterization of the chemical attachment on the surface can be done by spectroscopic means or by solvent treatment aimed to remove non-covalently attached material. ESCA/XPS can be used to quantify the surface atom composition prior to and following the polymer attachment/adsorption. SEM and TEM can be used to measure the corona thickness (because the polymer has a very different electron density than ZnSe) and the state of aggregation (number of ZnSe nanoparticles per composite particle). The amount of polymer present can be determined from a material balance (involving the weights of the reactants and product) and/or from a thermogravimetric analysis where the organic material is burned off while the inorganic material forms oxides.

The nanoparticles and various nanostructures of the present invention can be used in various applications in clinical diagnostics and proteomics. Such suitable applications are included below by way of example. In particular, the development of "sandwich-type" immunoassays using fluorescent nanocrystals (quantum dots) can be achieved. This immunoassay can be used to detect antigens (e.g., drugs, proteins, or biological infectious agents), using the specific binding between an antibody and the antigen under scrutiny. In multiplexing form, a sandwich-type immunoassay can be used to simultaneously detect several antigens using two populations of antibodies that can selectively bind each antigen. As an example, suitable components of the assay can include: (1) a surface (e.g., the inner surface of a cavity) fuctionalized with streptavidin; (2) a population of a biotinylated antibody for each antigen to be detected (e.g., an antibody linked to biotin, which is a protein that has high affinity for streptavidin); and (3) a second population of a labeled antibody for each antigen to be detected (e.g., an antibody that has been linked to semiconductor nanocrystals of specific size that can fluoresce at a specific wavelength). A different population of nanocrystals can be used to label the antibodies of different antigens. Further, the nanocrystal populations can be chosen to emit at distinct wavelengths that can be detected simultaneously and uniquely when all populations are present in the same solution.

As an example, the detection of the antigens can be achieved using the following steps: (1) exposure of the surface of the cavity to an aqueous solution containing the biotynilated antibody populations and incubation for a few minutes to allow binding of the antibodies to the surface; (2) a wash step with water to remove the unbound biotynilated antibodies; (3) exposure of the surface to the sample that possibly contains the antigens to be detected and incubation for a few minutes to allow specific binding of the antigens to the biotinylated antibodies that are bound to the surface; (4) a wash step with water to remove all unbound matter; (5) exposure to an aqueous solution containing the labeled antibody populations and incubation for a few minutes to allow specific binding of the labeled antibodies with the antigens; (6) a wash step with water to remove all unbound material from the cavity; (7) the cavity is exposed to UV light with wavelength shorter than the smallest wavelength at which emission is expected from the nanocrystals; (8) detection of emitted light from the surface at a specific wavelength, corresponding to the labeled antibodies of a certain antigen, provides a positive detection of the antibody in question; (9) multiplexing is achieved by the ability to simultaneously detect several antigens; and (10) quantitative analysis can be achieved by calibrating the intensity of the emitted light with known concentrations of the corresponding antigen. A variation of the above procedure for speedup of the detection time utilizes a mixture of all antibody populations and the sample and a single incubation step followed by a wash step. This procedure can be useful when multiplexing is not essential but a quick response time is needed, such as for detection of biological warfare agents in the field.

The nanoparticles and nanostructures of the present invention can also be used in coatings, cosmetics, and surface treatments. For example, a nanostructure-loaded emulsion can be used in formulations of surface coatings (e.g., paints) that respond to UV light from natural (e.g., from the sun) or manmade sources (e.g., UV lamps). The formulations may include additional components, such as inorganic particles (for opacity) and polymeric particles (for film formation). These coatings will change color when the UV source is present and return to their original color (or transparency) when the UV source is eliminated. Potential applications can include, for example: (1) applications related to camouflage of equipment that include coatings and patterns attaining specific colors during the day by utilizing the luminescence of the nanocrystals and a different color at night when the excitation from the sun's UV radiation is not present; (2) architectural, automotive, and general-purpose coatings that can change color when exposed to sunlight due to emission from the nanocrystals and attain a different color at night; (3) cosmetics that respond to sunlight with a temporary change of color enabled by the luminescence of the nanocrystals (the original color (or transparency) is recovered when the UV source is eliminated); and (4) apparel that contain such nanocrystal formulations providing the ability to change color when exposed to a UV source and to recover the original color upon elimination of the UV radiation (for civilian or military applications).

EXAMPLES

The following examples are provided to illustrate embodiments of the present invention but are by no means intended to limit its scope.

Example 1

Formation of Liquid Crystalline Templates Using Water and p-Xylene

The liquid crystalline templates were prepared at room temperature by mixing specific amounts of PEO-PPO-PEO block copolymer with p-xylene ($P-C_8H_{10}$) as the less polar phase and a 1 M solution of zinc acetate dihydrate (Zn $(C_2H_3O_2)_2 \cdot 2H_2O$) in water ($H_2O$) as the polar phase, in screw cap glass vials. PPO is the p-xylene-soluble block and PEO is the water-soluble block. The amount of each component in the mixture depends on the type of the liquid crystalline phase of interest. For example, a mixture composed of 58 wt % PEO-PPO-PEO, 32 wt % p-xylene, and 10 wt % of 1 M zinc acetate dihydrate in water yields a reverse (water-in-xylene) cubic liquid crystalline phase, whereas a mixture composed of 31 wt % PEO-PPO-PEO, 2 wt % p-xylene, and 67 wt % of 1 M zinc acetate dihydrate in water yields a normal (xylene-in-water) cubic liquid crystalline phase. The former mixture will yield solid nanostructures, i.e., quantum dots, whereas the latter mixture will yield hollow nanostructures, i.e., hollow nanospheres. The total mass of each sample was 0.5 grams which corresponded to 0.29 g of PEO-PPO-PEO, 0.16 g of p-xylene, and 0.05 g of zinc acetate dihydrate, and 0.155 g of PEO-PPO-PEO, 0.01 g of p-xylene, and 0.335 g of zinc acetate dihydrate, respectively. In addition, it is possible to tune the zinc acetate dihydrate concentration to any value in order to obtain a desired final nanocrystal size, i.e., more zinc acetate dihydrate equals a larger nanocrystal. These samples formed a layer with thickness of approximately 1 mm in each vial.

The samples were mixed by adding to the screw cap glass vial, in order, the appropriate amounts of PEO-PPO-PEO, p-xylene, and water/zinc acetate dihydrate, followed by shaking for several minutes. The water/zinc acetate dihydrate solution was formed in advance in a separate vial by adding the appropriate amount of zinc acetate dihydrate in the appropriate amount of water and shaking the mixture for about 2 minutes until complete homogenization was achieved. For example, for a 1 M zinc acetate dihydrate in water solution, 2.2 grams zinc acetate dihydrate was added to 8.7 ml of water. After mixing, the vials were capped firmly and paraffin tape was applied around the caps for better sealing. The sample was centrifuged repeatedly at 3,000 rpm in alternating directions, for 2 minutes in each direction, to facilitate homogenization. After the mixtures were homogenized they were left to equilibrate over the course of several days, preferably approximatedly 1 week, until optically isotropic and transparent gels were obtained, which was an indication of liquid crystal formation. The samples were subsequently placed in a polarized light device in order to visually inspect and identify the liquid crystalline phase. For example, under polarized light, cubic liquid crystals are isotropic/non-birefringent, whereas hexagonal and lamellar liquid crystals are anisotropic/birefringent.

Using the procedures described above, different liquid crystalline templates were formed by varying the relative amounts of block copolymer, e.g., PEO-PPO-PEO, polar phase, e.g., zinc acetate dihyrdrate in water, and nonpolar phase, e.g., p-xylene, as illustrated in Examples 3-6 described herein.

All chemicals were used 'as received' without any additional purification. Care was taken to avoid exposure of the hygroscopic PEO-PPO-PEO block copolymer to atmospheric moisture. Zinc acetate dihydrate was purchased from Fisher Scientific, p-xylene (99+%) was purchased from Alpha Aesar, and electronic-grade hydrogen selenide gas (5% mixture with hydrogen) was purchased from Solkatronic Chemicals. Pluronic P105 PEO-PPO-PEO block copolymer (with molecular formula: $EO_{37}PO_{58}EO_{37}$ according to its nominal MW of 6,500 and 50% PEO content) was obtained from BASF Corporation. Ultra pure water (Milli-Q) was used throughout the experiments.

Photoluminescence (PL) emission spectra were obtained by dissolving a small amount of the processed liquid crystals containing the ZnSe nanocrystals in 200 proof ethanol, loading this suspension into quartz cuvettes, and analyzing it using a 0.5 m single-stage spectrometer (CVI Laser Corp.) equipped with a thermoelectrically cooled multichannel CCD detector (Camera AD-205, which operates at a wavelength range of 200-1100 nm). A 325 nm line of a 35 mW He—Cd UV laser (Melles Griot) was used to excite the nanocrystals. The samples tested by transmission electron microscopy (TEM) were prepared by placing a drop of the ethanol suspension on a 400-mesh carbon-coated copper grid (purchased from Ernest F. Fullam, Inc.). It should be noted that the nanostructures according to the present invention are robust, i.e., they have survived precipitation and drying after dissolution of the processed liquid crystal in ethanol. The instrument used was a JEOL JEM 2010 high-resolution transmission electron microscope, operated at 200 kV, with a point-to-point resolution of 0.193 nm. Samples for X-ray diffraction ("XRD") analysis were prepared by depositing a few drops of the ethanol suspension on a clean silicon wafer and evaporating the solvents. The instrument used was a Siemens D500 XR X-ray diffractometer. The same protocol used for XRD samples was also used to create samples for Energy Dispersive X-ray Spectroscopy (EDS). The instrument used was a Hitachi S-4000 field emission SEM, operated at 25 kV.

Example 2

Templated Synthesis of ZnSe Nanostructures

A septum vial containing a PEO-PPO-PEO/water/p-xylene liquid crystalline template, which was made according to the protocol above, was placed inside a reactor. The reactor was a tubular stainless steel chamber with a diameter of 1 inch that was used to accommodate the vial containing the template. The air was removed from the system by a pulling vacuum for 15 min. and a subsequent 20 min. flow of $N_2$ into the system. The reactor was equipped with an inner tube with a diameter of ¼ inch that was used for the transfer of gas. Under 1 atm of $N_2$, the reactor inner tube was inserted into the vial through the septum, which allowed contact between the liquid crystal and the surrounding gas. The $N_2$ was subsequently removed by evacuation, and the reactor was immediately backfilled with a 5% $H_2Se$ in $H_2$ gas mixture, at room temperature, until a pressure of 1 atm. was obtained. A 6-hour contact between $H_2Se$ and the Zn-doped liquid crystal was found to be sufficient to convert all zinc acetate dihydrate into ZnSe.

After the reaction, five cycles of evacuation/backfilling with $N_2$ were performed in order to remove all traces of $H_2Se$. All gaseous byproducts were passed through a tubular cracking furnace at a temperature higher than 200° C. before being released into a fume hood. The experiment was performed under a vented enclosure and a hydride detector was used to ensure personnel safety. The vial was taken out of the reactor, then capped and transferred to a fume hood where approximately 0.01 g of the processed liquid crystal, having a yellow coloration, was dissolved in about 2 ml of anhydrous ethanol (200 proof) in order to perform nanocrystal characterization.

The overall reaction that forms ZnSe is: $Zn(CH_3COO)_2$+ $H_2Se \rightarrow ZnSe_{(c)}$=$2CH_3COOH$. This reaction occurs spontaneously at room temperature and is exothermic. A similar reaction has been used for growing single-crystalline thin films of ZnSe by metallorganic vapour phase epitaxy (MOVPE) (Peck et al., "Metalorganic Vapor Phase Epitaxy of $Zn_{1-x}Fe_xSe$ Films," *J. Cryst. Growth* 170(1-4):523-527 (1997), which is hereby incorporated by reference in its entirety), and ZnSe nanoparticles by vapour-phase processing (Sarigiannis et al., "Characterization of Vapor-Phase-Grown ZnSe Nanoparticles," *Appl. Phys. Lett.* 80(21):4024-4026 (2002), which is hereby incorporated by reference in its entirety).

The most probable explanation for the formation of single-crystalline nanostructures by the present technique (and other room-temperature techniques (Leppert et al., "Structural and Optical Characteristics of ZnSe Nanocrystals Synthesized in the Presence of a Polymer Capping Agent," *Mater. Sci. Eng.* B 52(1):89-92 (1998); Kumbhojkar et al., "Quantum Confinement Effects in Chemically Grown, Stable ZnSe Nanoclusters," *Nanostruct. Mater.* 10(2):117-129 (1998); Quinlan et al., "Reverse Micelle Synthesis and Characterization of ZnSe Nanoparticles," *Langmuir* 16(8):4049-4051 (2000); Karanikolos et al., "Synthesis and Size Control of Luminescent ZnSe Nanocrystals by a Microemulsion-Gas Contacting Technique," *Langmuir* 20(3):550-553 (2004), which are hereby incorporated by reference in their entirety) is an annealing mechanism due to the energy released during coalescence of small nanocrystals and clusters to form the final particle (Lehtinen et al., "Effect of Coalescence Energy Release on the Temporal Shape Evolution of Nanoparticles," *Phys. Rev.* B 63:205402-205409 (2001), which is hereby incorporated by reference in its entirety). The energy released is due to the minimization of the unsaturated surface bonds. The annealing is aided by a depression of the melting point with particle size, which is expected to be similar to the melting point depression reported for CdS nanocrystals (Goldstein et al., "Meeting in Semiconductor Nanocrystals," *Science* 256:1425-1427 (1992), which is hereby incorporated by reference in its entirety). Due to the melting point depression, the annealing can proceed at much lower temperatures than the ones required for annealing of bulk crystals. Modeling of thermal effects during cluster and nanocrystal coalescence in the templates presented here indicates that the energy release during coalescence is sufficient to locally raise the temperature of the resulting nanocrystals to enable annealing (and even melting), before energy dissipation by conduction to the surrounding medium can cool the nanocrystals back to room temperature (Kostova et al., "Multi-Scale Models of the Synthesis of Compound Semiconductor Nanocrystals (Quantum Dots) Using Microemulsions as Templates," *AIChE Annual Mtg (Austin, Tex., November* 2004) paper 590 g (manuscript in preparation) (2005), which is hereby incorporated by reference in its entirety). The net energy released during this process is very small and the macroscopically observed temperature of the system remains at room temperature.

Example 3

Properties of ZnSe Quantum Dots

Figure 4:
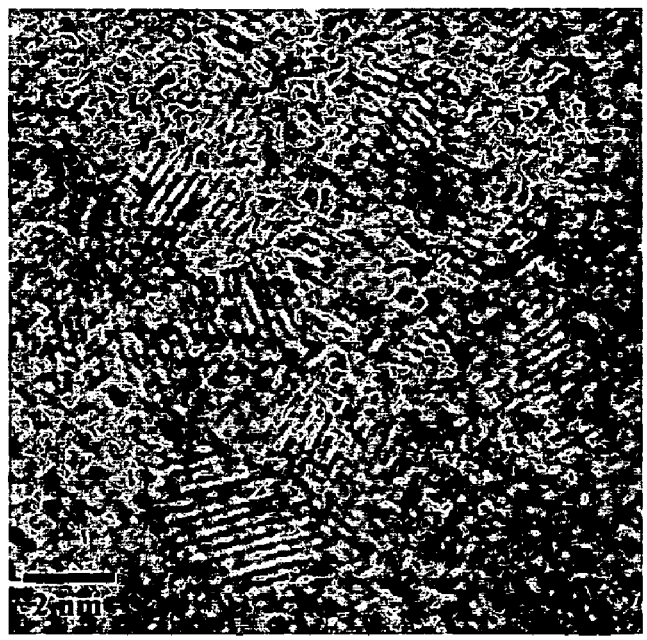
FIG. 4 is an HR-TEM image of ZnSe quantum dots.

ZnSe synthesized particles are crystalline in nature, as revealed by high resolution TEM ("HR-TEM") (FIG. 4), and have an average diameter of 3 nm. The quantum dots in FIG. 4 were grown using a liquid crystalline template with composition 55 wt % PEO-PPO-PEO, 23 wt % p-xylene, and 22 wt % of 1 M zinc acetate dihydrate in water. Using this liquid template, formed according to the methods set forth in Example 1, the production of the nanostructures was completed as described above. In order for the TEM analysis to be carried out, the liquid crystalline template containing the nanocrystals was dispersed in ethanol, a few drops of the dispersion were placed on a TEM grid, and the solvents were evaporated in a fume hood.

Figure 5:
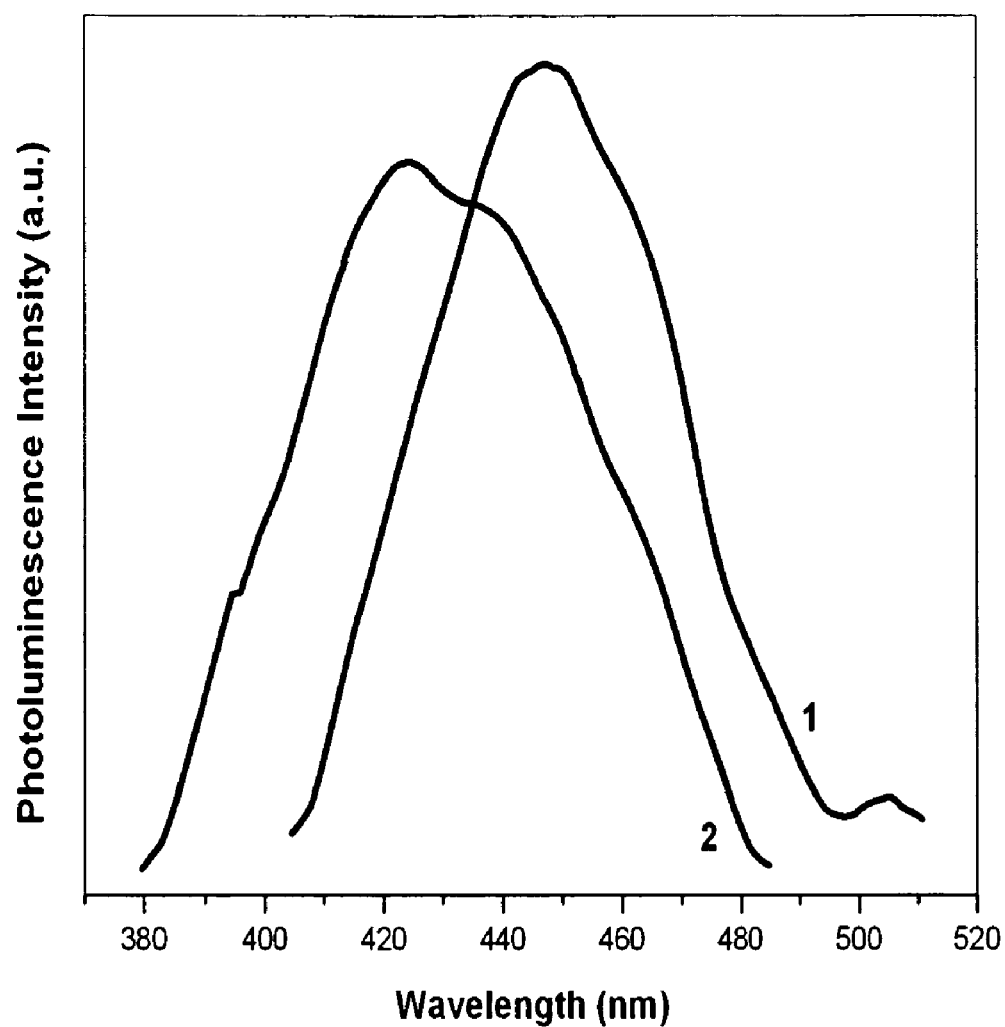
FIG. 5 illustrates room-temperature photoluminescence of ZnSe quantum dots.

Room-temperature photoluminescence spectra of synthesized ZnSe quantum dots are shown in FIG. 5. Spectrum (1) corresponds to a template composition of 50 wt % PEO-PPO-PEO, 33 wt % p-xylene, and 17 wt % of 1 M zinc acetate dihydrate in water, and spectrum (2) corresponds to a template composition of 58 wt % PEO-PPO-PEO, 32 wt % p-xylene, and 10 wt % of 1 M zinc acetate dihydrate in water. Using these liquid templates, the production of the nanostructures was completed as described above. The bulk exciton Bohr diameter for ZnSe, below which quantum confinement is expected, is 9 nm and the bulk emission wavelength is 460 nm. There is an apparent blue-shift from spectrum (1) to spectrum (2) due to the increase in the molar ratio of block copolymer to dispersed phase from sample (1) to sample (2), which yields smaller spherical nanodomains.

The size of the nanocrystals can also be tuned by manipulating the concentration of zinc acetate dihydrate in the polar domains. Suitable concentrations range from about 0.001 M to about 2 M of zinc acetate dihydrate, or any other concentration at which the liquid crystalline template is stable. This same approach has been demonstrated in previous work employing microemulsion templates for ZnSe quantum dot synthesis (Karanikolos et al., "Synthesis and Size Control of Luminescent ZnSe Nanocrystals by a Microemulsion-Gas Contacting Technique," *Langmuir* 20(3):550-553 (2004), which is hereby incorporated by reference in its entirety).

Example 4

Properties of ZnSe Hallow Nanospheres

Figure 7:
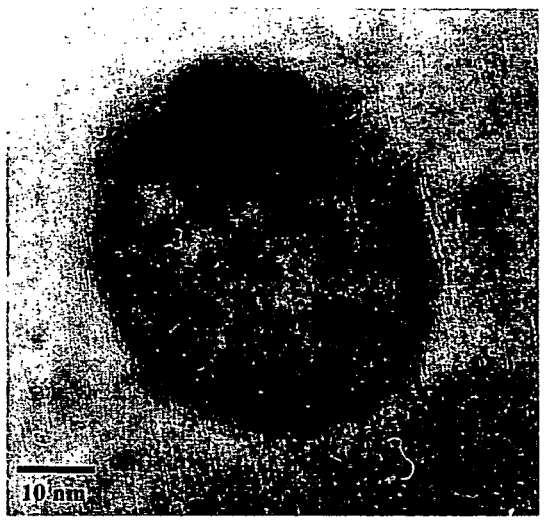
FIGS. 7A-B are TEM images of ZnSe hollow spheres made from two different template compositions.
Figure 7:
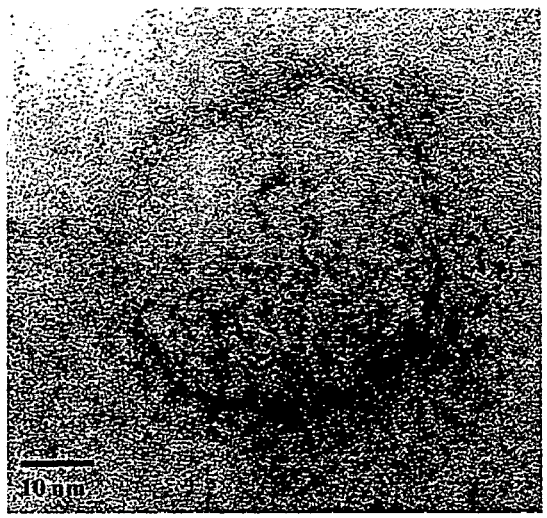

FIGS. 7A-B show TEM images of synthesized hollow nanospheres using two different template compositions. FIG. 7A corresponds to 31 wt % PEO-PPO-PEO, 2 wt % p-xylene, and 67 wt % of 1 M zinc acetate dihydrate in water. FIG. 7B corresponds to 47 wt % PEO-PPO-PEO, 14 wt % p-xylene, and 39 wt % of 1 M zinc acetate dihydrate in water. Using these liquid templates, formed according to the methods set forth in Example 1, the production of the nanostructures was completed as described above. The average diameter of the synthesized hollow spheres is 45 nm. In the presence of zinc acetate dihydrate, there is a strong interaction between block copolymer and $Zn^{2+}$ ions that enlarges the micelles, as has also been reported for preparation of ZnS hollow spheres using a PEO-PPO-PPO/zinc acetate-in-water/thioacetamide system (Ma et al., "Facile Synthesis of Hollow ZnS Nanospheres in Block Copolymer Solutions," *Langmuir* 19:4040-4042 (2003), which is hereby incorporated by reference in its entirety). The shell thickness is controlled by manipulating the water-zinc acetate dihydrate content of the liquid crystalline template. An average thickness of 4 nm was formed using 67 wt % of 1 M zinc acetate dihydrate in water, FIG. 7A, whereas the shell thickness was reduced to 2 nm when a 39 wt % of 1 M zinc acetate dihydrate in water content was used, as shown in FIG. 7B.

Example 5

Properties of ZnSe Nanotubes

Figure 9:
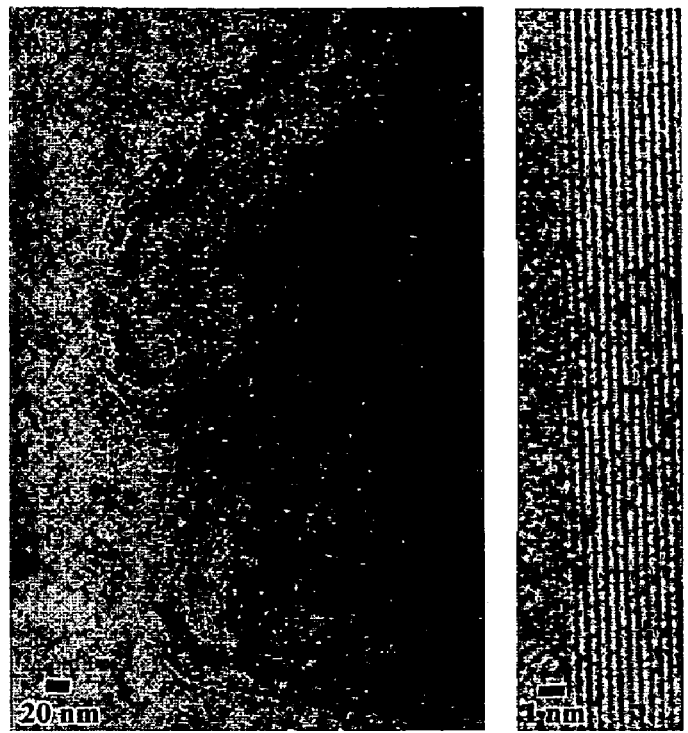
FIGS. 9A-B are TEM and HR-TEM images, respectively, of ZnSe nanotubes.

TEM images of the synthesized ZnSe nanotubes are shown in FIGS. 9A-B. Nanotubes with an average diameter of 25 nm and a 7 nm average wall thickness were grown using a template composition of 49 wt % PEO-PPO-PEO, 17 wt % p-xylene, and 34 wt % of 1 M zinc acetate dihydrate in water. Using this liquid template, formed according to the methods set forth in Example 1, the production of the nanostructures was completed as described above. FIG. 9B shows a high resolution TEM image of the synthesized material demonstrating good crystalline quality.

Figure 10:
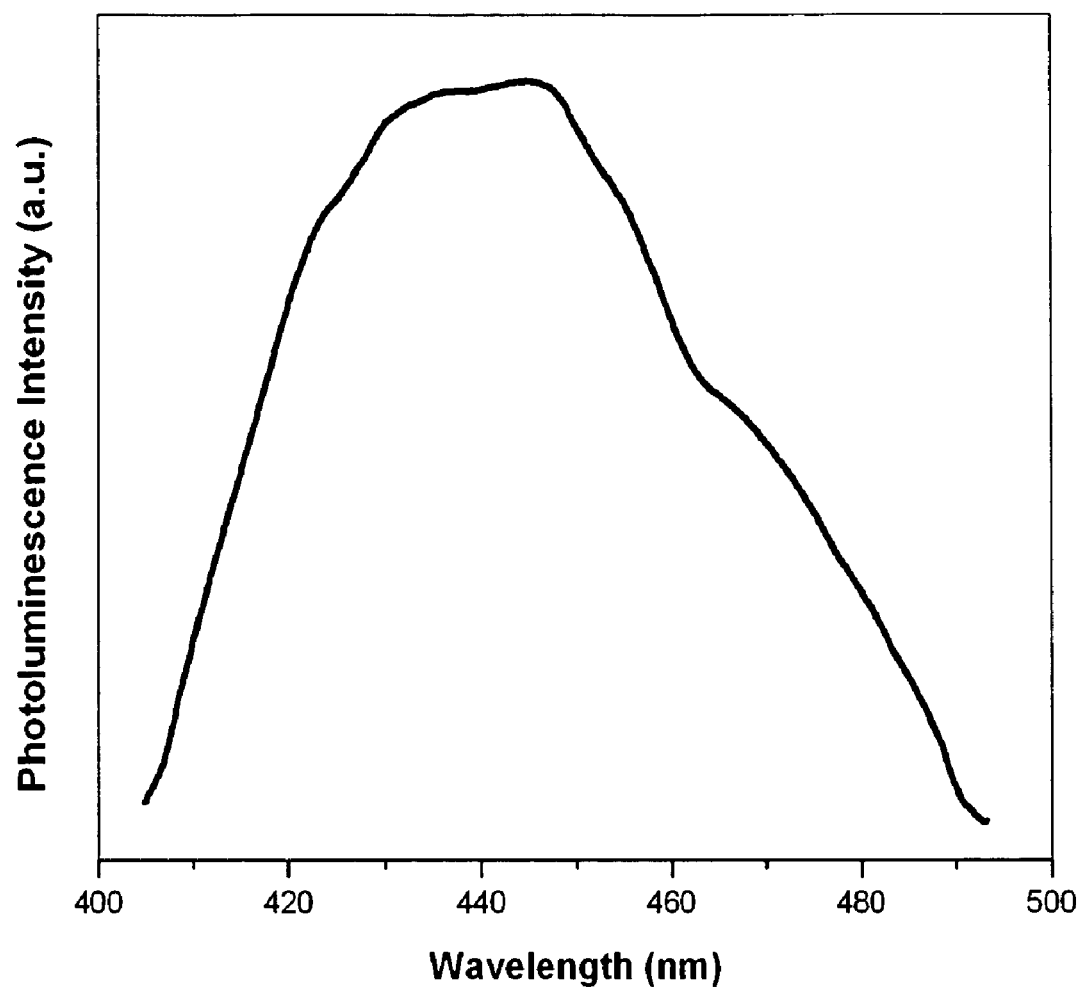
FIG. 10 illustrates room-temperature photoluminescence of ZnSe nanotubes.
Figure 11:
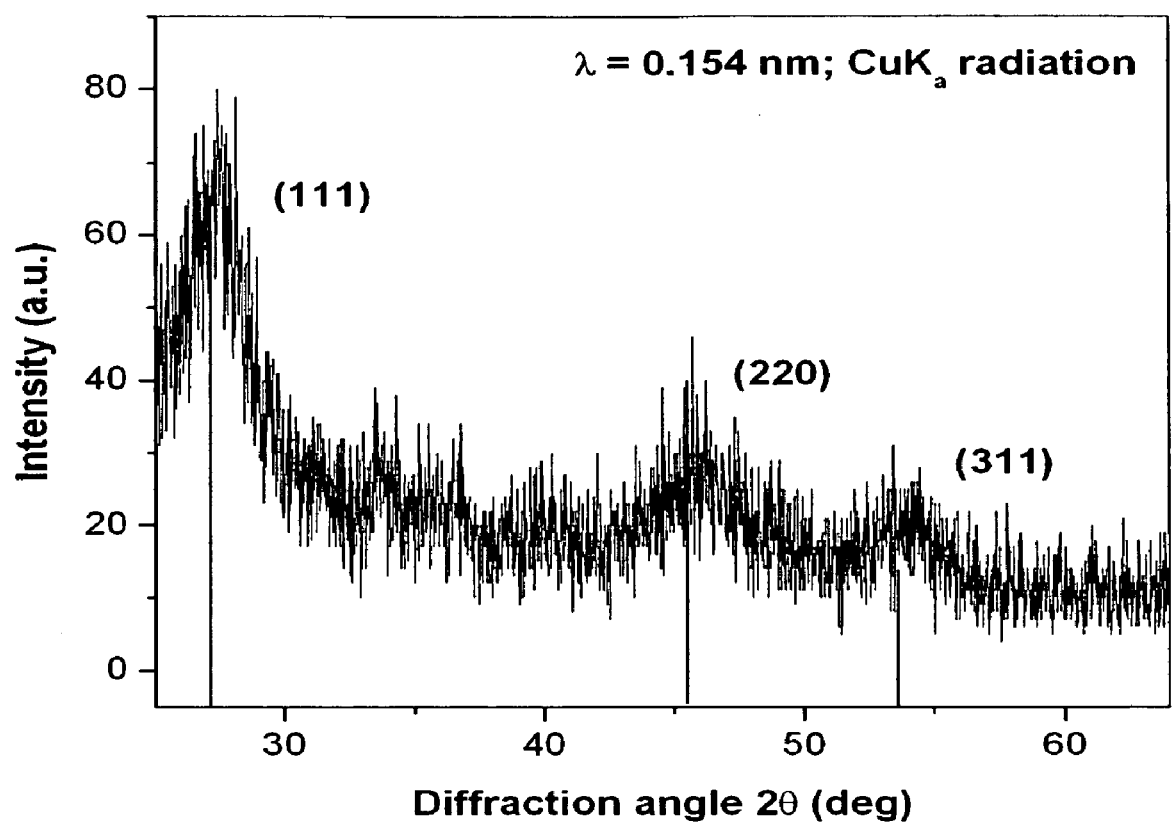
FIG. 11 shows the X-ray diffraction pattern from ZnSe nanotubes.

The synthesized ZnSe nanotubes are luminescent at room temperature and their emission wavelength is blue-shifted compared to the bulk value of 460 nm, as shown in FIG. 10. This indicates that the nanotubes exhibit quantum confinement, which results from the fact that their wall thickness is less than the ZnSe confinement threshold of 9 nm, as confirmed by TEM analysis (FIG. 9A). X-ray diffraction analysis of the synthesized nanotubes confirms their crystalline structure, as revealed by the X-ray diffraction pattern in FIG. 11. The observed diffraction peaks match the standard peaks at 27.2°, 45.2°, and 53.6° that correspond to the diffraction angles from the (111), (220), and (311) planes of cubic (zinc blende) ZnSe. The low intensity and significant noise of the X-ray diffraction peaks are attributed to the small mass ratio of ZnSe nanotubes to block copolymer (of the order of 9 wt %) after solvent evaporation.

Example 6

Properties of ZnSe Nanolaminates

Figure 13:
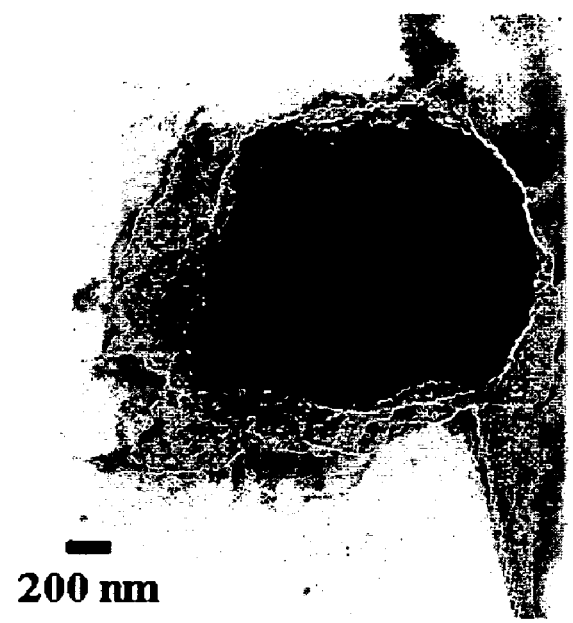
FIG. 13 is a TEM image of ZnSe nanolaminates.
Figure 14:
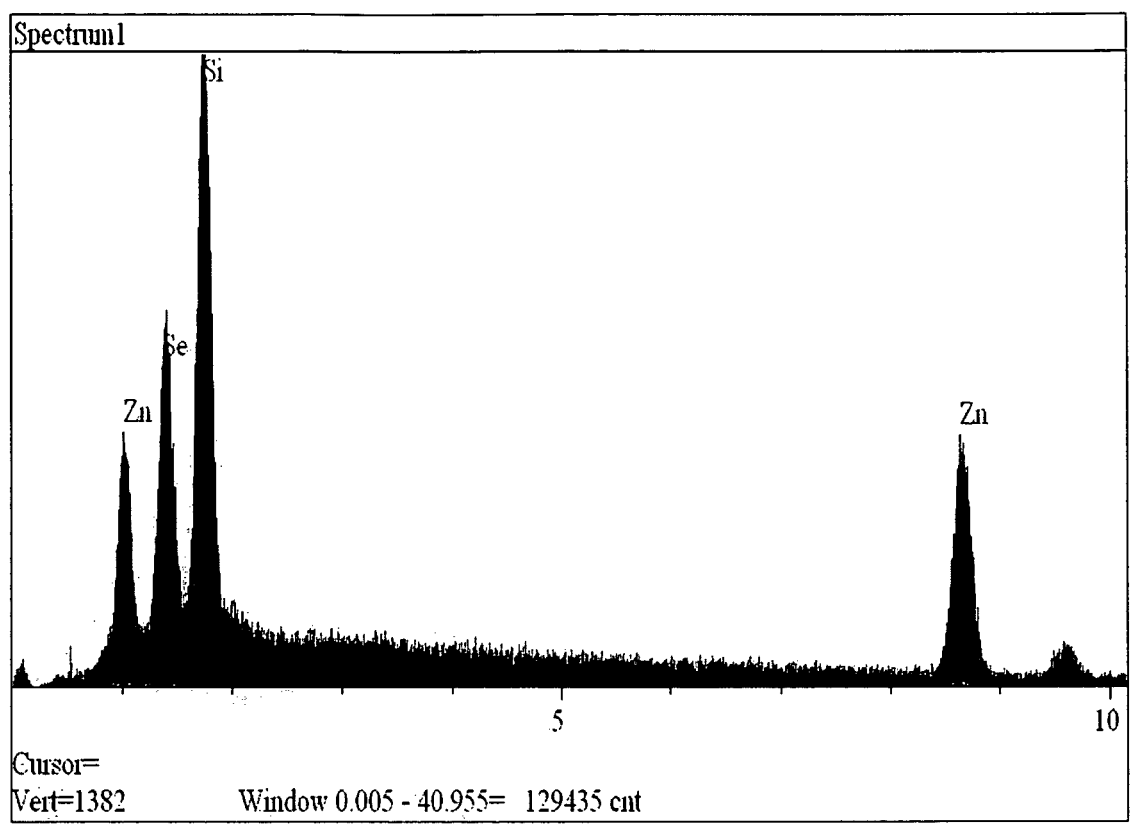
FIG. 14 shows an Energy Dispersive X-ray Spectroscopy spectrum of synthesized nanolaminates deposited on a silicon wafer.

FIG. 13 is a TEM image of the synthesized ZnSe nanolaminates. The lamellar liquid crystal used is composed of 56 wt % PEO-PPO-PEO, 6 wt % p-xylene, and 38 wt % of 1 M zinc acetate dihydrate in water. Using this liquid template, formed according to the methods set forth in Example 1, the production of the nanostructures was completed as described above. According to the image, the nanolaminates extend up to ~2 μm along the growth plane, whereas their thickness is estimated to be on the order of the thickness of the polar lamellae (i.e., approximately 7 nm). The nanolaminates are grown parallel to each other following the morphology of the lamellar template. The overlap of the nanolaminates, as shown in the TEM image, is the result of the sample preparation protocol used for TEM analysis; specifically, the excess of block copolymer that is originally in between adjacent nanolaminates is dissolved by the ethanol solvent. FIG. 14 shows the Energy Dispersive X-ray Spectroscopy ("EDS") spectrum of the synthesized nanolaminates deposited on a silicon wafer, which confirms that their chemical composition is ZnSe.

Figure 15:
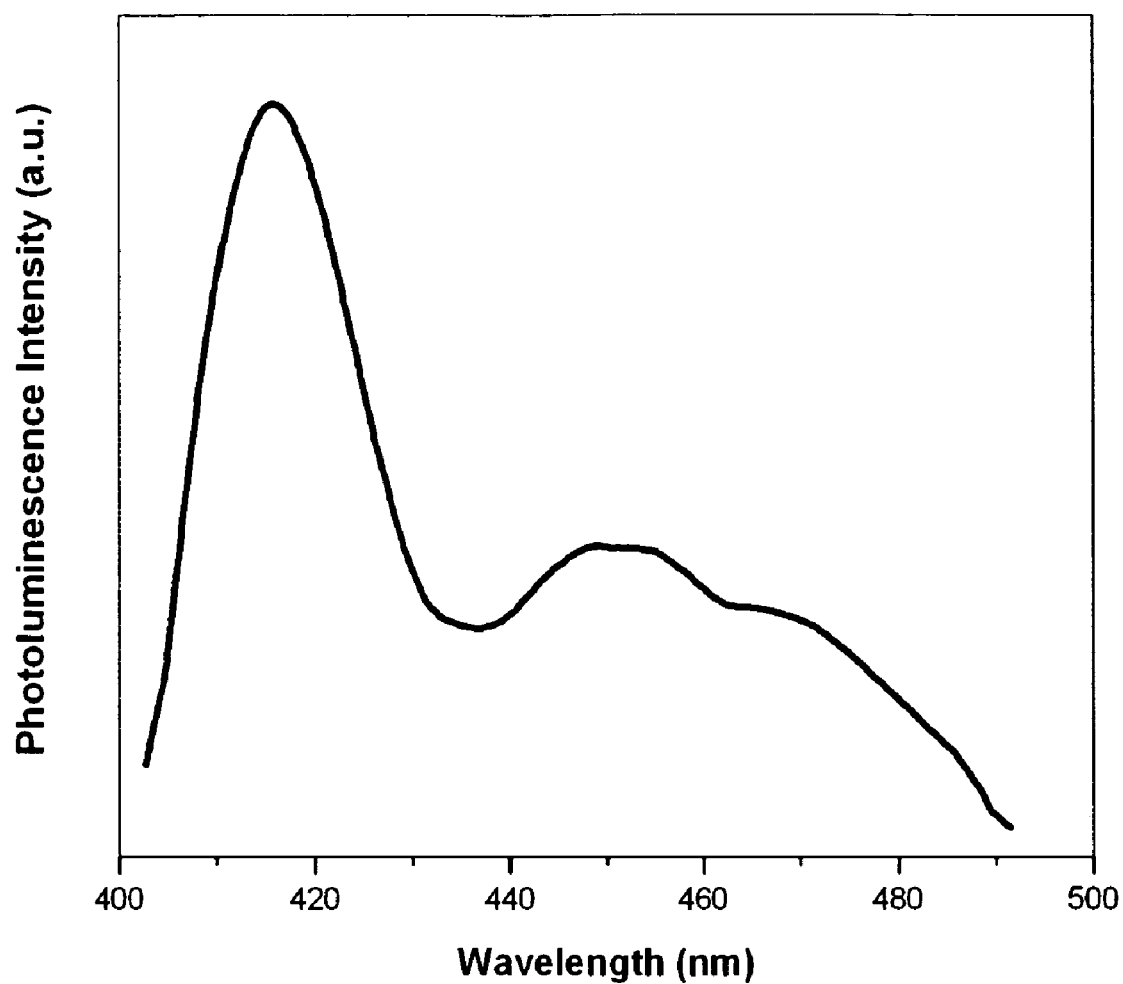
FIG. 15 illustrates room-temperature photoluminescence of ZnSe nanolaminates.

The room-temperature photoluminescence of ZnSe nanolaminates grown using a template composition of 56 wt % PEO-PPO-PEO, 6 wt % p-xylene, and 38 wt % of 1 M zinc acetate dihydrate in water is illustrated in FIG. 15. The emission peak (at around 415 nm) is blue-shifted compared to bulk ZnSe (460 nm) indicating that the nanolaminates (free-standing quantum wells) exhibit quantum confinement. This two-dimensional quantum confinement only occurs when the average thickness of the synthesized nanolaminates is below the bulk ZnSe confinement threshold of 9 nm, which indicates that the thickness of the produced nanolaminates is of the same scale as the thickness of the polar lamellae (i.e., around 7 nm or smaller). In addition, the narrow width of the emission peak indicates that the nanolaminate thickness is uniform. The evidence of a low-energy shoulder on the spectrum at around 460 nm is attributed to the presence of some bulk material formed by coalescence of small ZnSe particles outside the water nanodomains. The presence of such particles can be attributed to reaction of $H_2Se$ with a small amount of zinc acetate dihydrate that dissolved into the p-xylene phase during the template formation (the solubility of water in p-xylene is small but non-zero).

According to the present invention, stable lyotropic liquid crystalline templates, formed by self-assembly of a PEO-PPO-PEO/water/p-xylene ternary system, were employed to control the shape and size of compound semiconductor nanocrystals. PEO-PPO-PEO block copolymers, due to their amphiphilic character, exhibit very rich structural polymorphism when dissolved in selective solvents of different polarity, forming microstructures such as spheres, cylinders, and lamellae. Using ZnSe as an example, it has been demonstrated that these self-assembled nanodomains can be used as templates to produce a variety of different semiconductor nanostructures. In addition to quantum dots grown in the spherical nanodomains of reverse cubic liquid crystals, also demonstrated is the synthesis of hollow spheres and hollow tubes around the dispersed spherical and cylindrical nanodomains of the normal cubic and hexagonal phases respectively, as well as growth of free-standing quantum wells (nanoplates or nanolaminates) in lamellar liquid crystals. This is the first reported synthesis of ZnSe nanotubes. The growth of the nanomaterial starts with a direct nucleation reaction between zinc acetate dihydrate that has been dissolved in the water phase and hydrogen selenide gas that is allowed to diffuse through the template. The zinc selenide nuclei that are formed in the water nanodomains grow by surface reactions with unreacted precursors and by cluster-cluster coalescence to yield nanocrystals of various sizes and shapes. The shape and size of the nanocrystals can be precisely controlled by selecting the structure of the templating phase, by tuning the size of the nanodomains, and by manipulating the concentration of the zinc precursor.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A process for synthesizing nanostructures, said process comprising:
    providing a first reactant in a polar phase;
    forming a liquid crystalline template containing the first reactant;
    contacting the liquid crystalline template with a gas phase comprising a second reactant diluted in a carrier gas; and
    allowing the second reactant to react with the first reactant;
    under conditions effective to form nanostructures.

2. The process according to claim 1, wherein the first reactant comprises a metal acetate compound.

3. The process according to claim 2, wherein the metal comprises Zn, Cd, Hg, Pb, Mn, or Fe.

4. The process according to claim 2, wherein the metal acetate compound comprises Zn acetate, Cd acetate, Hg acetate, Pb acetate, Mn acetate, or Fe acetate.

5. The process according to claim 1, wherein the first reactant comprises a metal acetate dihydrate compound.

6. The process according to claim 5, wherein the metal acetate dihydrate compound is Zinc acetate dihydrate.

7. The process according to claim 1, wherein said process is performed between about 5° C. and about 50° C. and between about 1.0 and about 2.0 atmospheres of pressure.

8. The process according to claim 1, wherein said forming of a liquid crystalline template comprises:
    providing a block copolymer;
    providing a nonpolar phase; and
    allowing the block copolymer, nonpolar phase, and said first reactant in a polar phase to come into contact with each other, such that said polar phase is continuous and said nonpolar phase is dispersed within the continuous phase, under conditions effective to form said liquid crystalline template.

9. The process according to claim 8, wherein the block copolymer is comprised of poly (ethylene oxide) and poly (propylene oxide).

10. The process according the claim 8, wherein the polar continuous phase is a non-reactive polar solvent.

11. The process according the claim 8, wherein the polar continuous phase is water.

12. The process according to claim 8, wherein the nonpolar dispersed phase is an organic solvent.

13. The process according to claim 12, wherein said organic solvent is an alkene.

14. The process according to claim 13, wherein said alkene is p-xylene.

15. The process according to claim 8, wherein said process is performed between about 5° C. and about 50° C. and between about 1.0 and about 2.0 atmospheres of pressure.

16. The process according to claim 1, wherein said forming of a liquid crystalline template comprises:
    providing a block copolymer;
    providing a nonpolar phase; and
    allowing the block copolymer, nonpolar phase, and said first reactant in a polar phase to come into contact with each other, such that said nonpolar phase is continuous and said polar phase is dispersed within the continuous phase, under conditions effective to form said liquid crystalline template.

17. The process according to claim 16, wherein the block copolymer is comprised of poly (ethylene oxide) and poly (propylene oxide).

18. The process according the claim 16, wherein the polar dispersed phase is a non-reactive polar solvent.

19. The process according the claim 16, wherein the polar dispersed phase is water.

20. The process according to claim 16, wherein the nonpolar continuous phase is an organic solvent.

21. The process according to claim 20, wherein said organic solvent is an alkene.

22. The process according to claim 21, wherein said alkene is p-xylene.

23. The process according to claim 16, wherein the process is performed between about 5° C. and about 50° C. and between about 1.0 and about 2.0 atmospheres of pressure.

24. The process according to claim 1, wherein said second reactant is in the form of a gas or vapor.

25. The process according to claim 1, wherein said second reactant comprises a Group VI element-containing compound.

26. The process according to claim 25, wherein said Group VI element comprises Se, S, Te, or O.

27. The process according to claim 25, wherein said Group VI element-containing compound is in the form of a hydride.

28. The process according to claim 27, wherein said hydride is a hydride of Se, S, or Te.

29. The process according to claim 28, wherein said hydride of Se is $H_2Se$ gas.

30. The process according to claim 26, wherein said Group VI element is oxygen.

31. The process according to claim 30, wherein the oxygen-containing compound is in the form of molecular oxygen ($O_2$) gas, ozone ($O_3$) gas, or water ($H_2O$) vapor.

32. The process according to claim 26, wherein said Group VI element is Te.

33. The process according to claim 32, wherein the Te-containing compound is in the form of a vapor of dimethyl-Te, diethyl-Te, or diisopropyl-Te.

34. The process according to claim 1, wherein said carrier gas comprises hydrogen, nitrogen, helium, or argon.

35. The process according to claim 1, wherein said contacting comprises diffusing the gas phase over the liquid crystalline template under conditions effective to allow the second reactant to diffuse into the template and to react with the first reactant to form the nanostructures.

36. The process according to claim 1, wherein said contacting is performed at a temperature at which the liquid crystalline template remains stable at atmospheric pressure or at a pressure higher than atmospheric pressure.

37. The process according to claim 1, wherein said nanostructures have a diameter or thickness of between about 1 and about 100 nanometers.

38. The process according to claim 1, wherein said nanostructures are in crystalline form, polycrystalline form or amorphous form.

39. The process according to claim 1, wherein said nanostructures are nanocrystals.

40. The process according to claim 39, wherein said nanocrystals exhibit size-dependent luminescence or fluorescence.

41. The process according to claim 39, wherein said nanocrystals are PbSe or PbS nanocrystals.

42. The process according to claim 39, wherein said nanocrystals are luminescent Group II-Group VI nanocrystals of the form MX, wherein M is Zn, Cd, Hg, or Pb and wherein X is Se, S, Te, or O.

43. The process according to claim 42, wherein said nanocrystals are ZnSe nanocrystals.

44. The process according to claim 43, wherein said ZnSe nanocrystals have a diameter of between about 1 and about 200 nanometers.

45. The process according to claim 42, wherein said nanocrystals are CdSe nanocrystals.

46. The process according to claim 45, wherein said CdSe nanoerystals have a diameter of between about 1 and about 200 nanometers.

47. The process according to claim 1, further comprising incorporating a functional material onto the surface of said nanostructures.

48. The process according to claim 47, wherein said functional material is dissolved in an aliphatic hydrocarbon.

49. The process according to claim 48, wherein said aliphatic hydrocarbon is heptane.

50. The process according to claim 48, wherein said aliphatic hydrocarbon is octane.

51. The process according to claim 47, wherein said functional material is dissolved in an aromatic hydrocarbon.

52. The process according to claim 51, wherein said aromatic hydrocarbon is p-xylene.

53. The process according to claim 51, wherein said aromatic hydrocarbon is toluene.

54. The process according to claim 47, wherein said functional material is dissolved in heptane.

55. The process according to claim 47, wherein said functional material is added to the inner or outer surface of said nanostructure.

56. The process according to claim 47, wherein said functional material comprises either a thiol-based compound or an amine-based compound.

57. The process according to claim 1, further comprising isolating said nanostructures.

58. The process according to claim 1, wherein said nanostructures are of substantially the same size.

59. The process according to claim 58, wherein the size of said nanostructures is dependent on the initial concentration of the first reactant prior to said contacting.

60. A process for synthesizing hollow nanostructures, said process comprising:
   combining together 67 wt % zinc acetate dihydrate, 31 wt % poly (ethylene oxide) and poly (propylene oxide), and 2 wt % p-xylene, thereby forming a liquid crystalline template; and
   diffusing $H_2Se$ gas into said liquid crystalline template; wherein zinc acetate dihydrate reacts with $H_2Se$ to form hollow ZnSe nanostructures.

61. A process for synthesizing solid nanostructures, said process comprising:
   combining together 10 wt % zinc acetate dihydrate, 58 wt % poly (ethylene oxide) and poly (propylene oxide), and 32 wt % p-xylene, thereby forming a liquid crystalline template; and
   diffusing $H_2Se$ gas into said liquid crystalline template; wherein zinc acetate dihydrate reacts with $H_2Se$ to form solid ZnSe nanostructures.

62. A liquid crystalline template produced by the process comprising:
   providing a block copolymer;
   providing a nonpolar phase;
   providing a first reactant in a polar phase; and
   allowing the block copolymer, non-polar phase, and first reactant in a polar phase to come into contact with each other, such that said polar phase is continuous and said nonpolar phase is dispersed within the continuous phase, under conditions effective to form said liquid crystalline template.

63. The process according to claim 62, wherein the block copolymer is comprised of poly (ethylene oxide) and poly (propylene oxide).

64. The process according to claim 62, wherein the polar continuous phase is a non-reactive polar solvent.

65. The process according the claim 62, wherein the polar continuous phase is water.

66. The process according to claim 62, wherein the non-polar dispersed phase is an organic solvent.

67. The process according to claim 66, wherein said organic solvent is an alkene.

68. The process according to claim 67, wherein said alkene is p-xylene.

69. The process according to claim 62, wherein said process is performed between about 5° C. and about 50° C. and between about 1.0 and about 2.0 atmospheres of pressure.

70. The process according to claim 62, wherein the first reactant comprises a metal acetate compound.

71. The process according to claim 70, wherein the metal comprises Zn, Cd, Hg, Pb, Mn, or Fe.

72. The process according to claim 62, wherein the first reactant comprises a metal acetate dihydrate compound.

73. The process according to claim 72, wherein the metal acetate dihydrate compound comprises Zn acetate dihydrate, Cd acetate dihydrate, Hg acetate dihydrate, or Pb acetate dihydrate.

74. The process according to claim 73, wherein the metal acetate dihydrate compound is Zinc acetate dihydrate.

75. A liquid crystalline template produced by the process comprising:
   providing a block copolymer;
   providing a nonpolar phase;
   providing a first reactant in a polar phase; and
   allowing the block copolymer, nonpolar phase, and first reactant in a polar phase to come into contact with each other, such that said nonpolar phase is continuous and said polar phase is dispersed within the continuous phase, under conditions effective to form said liquid crystalline template.

76. The process according to claim 75, wherein the block copolymer is comprised of poly (ethylene oxide) and poly (propylene oxide).

77. The process according to claim 75, wherein the polar dispersed phase material is a non-reactive polar solvent.

78. The process according the claim 75, wherein the polar dispersed phase material is water.

79. The process according to claim 75, wherein the non-polar continuous phase material is an organic solvent.

80. The process according to claim 79, wherein said organic solvent is an alkene.

81. The process according to claim 80, wherein said alkene is p-xylene.

82. The process according to claim 75, wherein said process is performed between about 5° C. and about 50° C. and between about 1.0 and about 2.0 atmospheres of pressure.

83. The process according to claim 75, wherein the first reactant comprises a metal acetate compound.

84. The process according to claim 83, wherein the metal comprises Zn, Cd, Hg, Pb, Mn, or Fe.

85. The process according to claim 75, wherein the first reactant comprises a metal acetate dihydrate compound.

86. The process according to claim 85, wherein the metal acetate dihydrate compound comprises Zn acetate dihydrate, Cd acetate dihydrate, Hg acetate dihydrate, or Pb acetate dihydrate.

87. The process according to claim 86, wherein the metal acetate dihydrate compound is Zn acetate dihydrate.

* * * * *

UNITED STATES PATENT AND TRADEMARK OFFICE
CERTIFICATE OF CORRECTION

PATENT NO. : 7,608,237 B2  Page 1 of 1
APPLICATION NO. : 11/391022
DATED : October 27, 2009
INVENTOR(S) : Alexandridis et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 474 days.

Signed and Sealed this

Twelfth Day of October, 2010

David J. Kappos
*Director of the United States Patent and Trademark Office*